(12) United States Patent
Song et al.

(10) Patent No.: US 11,935,593 B2
(45) Date of Patent: Mar. 19, 2024

(54) DUMMY CELL RESISTANCE TUNING IN NAND STRINGS

(71) Applicant: SanDisk Technologies LLC, Addison, TX (US)

(72) Inventors: Yi Song, San Jose, CA (US); Jiahui Yuan, Fremont, CA (US); Xiang Yang, Santa Clara, CA (US)

(73) Assignee: SanDisk Technologies LLC, Addison, TX (US)

( * ) Notice: Subject to any disclaimer, the term of this patent is extended or adjusted under 35 U.S.C. 154(b) by 115 days.

(21) Appl. No.: 17/824,143

(22) Filed: May 25, 2022

(65) Prior Publication Data

US 2023/0410906 A1 Dec. 21, 2023

(51) Int. Cl.
*G11C 16/04* (2006.01)
*G11C 16/08* (2006.01)
*G11C 16/10* (2006.01)
*G11C 16/28* (2006.01)

(52) U.S. Cl.
CPC .......... *G11C 16/0483* (2013.01); *G11C 16/08* (2013.01); *G11C 16/10* (2013.01); *G11C 16/28* (2013.01)

(58) Field of Classification Search
CPC ..... G11C 16/0483; G11C 16/08; G11C 16/10; G11C 16/28
See application file for complete search history.

(56) References Cited

U.S. PATENT DOCUMENTS

| | | | |
|---|---|---|---|
| 7,535,764 B2 | 5/2009 | Chin et al. | |
| 8,565,020 B2 * | 10/2013 | Futatsuyama | G11C 16/3436 365/185.17 |
| 9,373,396 B2 | 6/2016 | Ratnam et al. | |
| 9,443,597 B2 | 9/2016 | Dutta et al. | |
| 9,449,708 B2 * | 9/2016 | Hirai | G11C 16/3427 |
| 9,455,301 B2 | 9/2016 | Ratnam et al. | |
| 9,484,092 B2 | 11/2016 | Ratnam | |
| 9,484,093 B2 | 11/2016 | Ratnam et al. | |
| 9,922,709 B2 | 3/2018 | Ratnam et al. | |
| 10,008,271 B1 | 6/2018 | Diep et al. | |
| 10,373,697 B1 | 8/2019 | Lai et al. | |
| 11,348,644 B2 * | 5/2022 | Lee | G11C 16/14 |

* cited by examiner

*Primary Examiner* — Vanthu T Nguyen

(74) *Attorney, Agent, or Firm* — Vierra Magen Marcus LLP

(57) ABSTRACT

An apparatus includes a control circuit configured to connect to memory cells connected in series in NAND strings. Each NAND string includes a plurality of data memory cells coupled to a plurality of data word lines in series with a plurality of dummy memory cells connected to a plurality of dummy word lines. The control circuit configured to apply a first dummy word line voltage to one or more dummy word lines of the plurality of dummy word lines in a verify step of a program operation to program data memory cells. The control circuit is configured to apply a second dummy word line voltage to the one or more dummy word lines in a read operation to read the data memory cells.

20 Claims, 17 Drawing Sheets

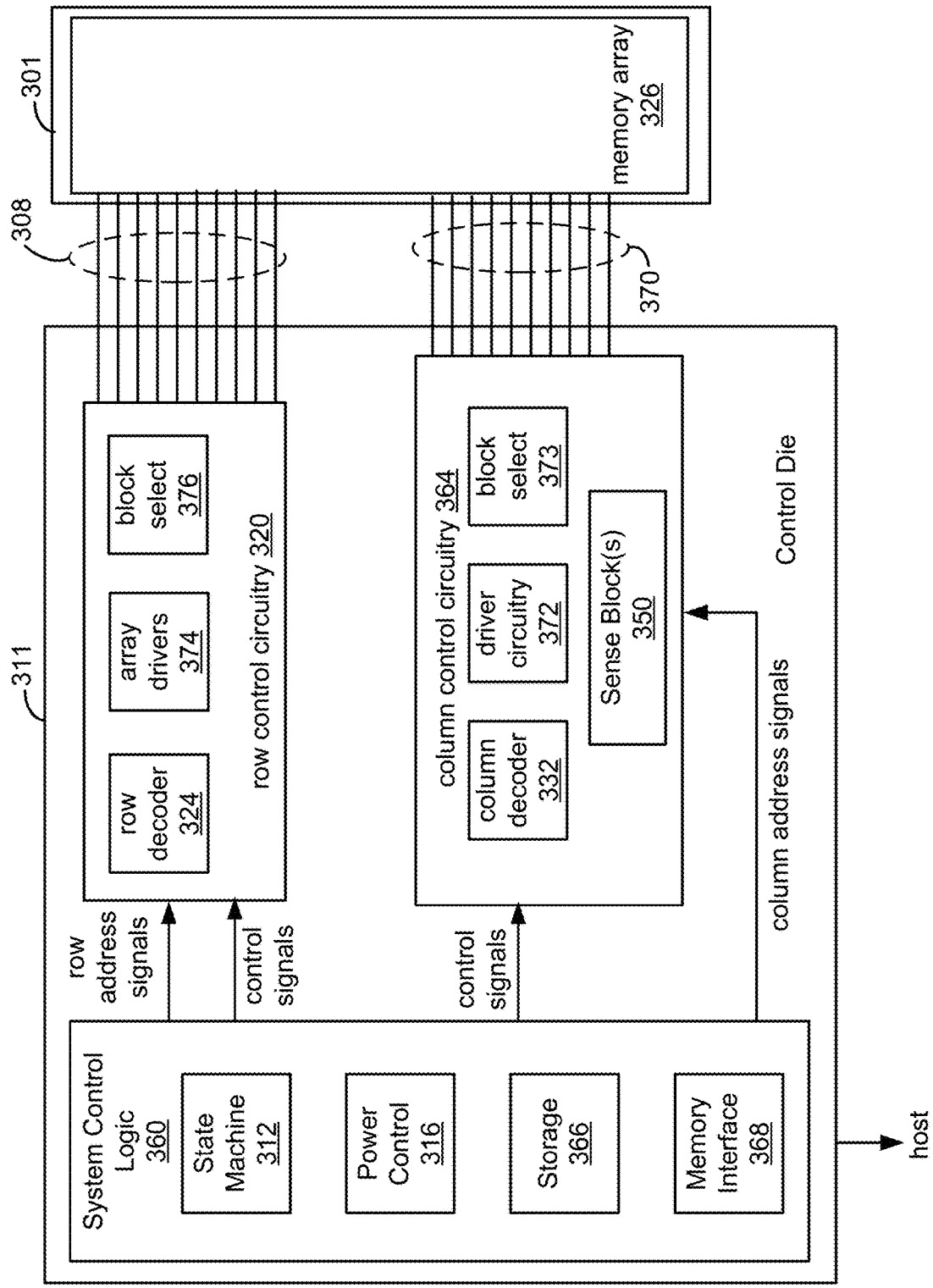

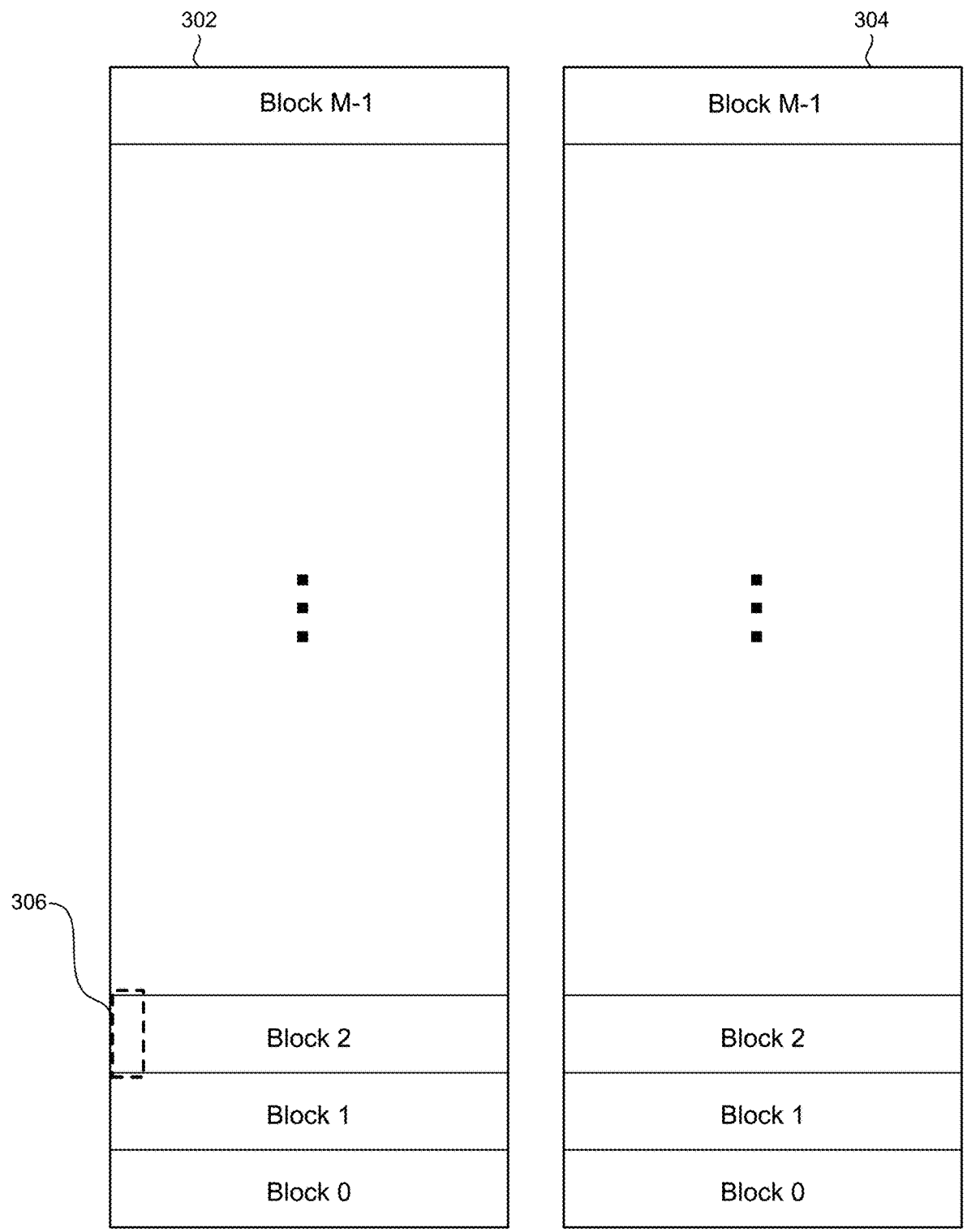

applying a first dummy word line voltage to one or more dummy word lines of the plurality of dummy word lines in a verify step of a program operation to program the data memory cells ~1160 subsequently, applying a second dummy word line voltage to the one or more dummy word lines of the plurality of dummy word lines in a read operation to read the data memory cells. ~1162

DUMMY CELL RESISTANCE TUNING IN NAND STRINGS

BACKGROUND

Semiconductor memory is widely used in various electronic devices such as cellular telephones, digital cameras, personal digital assistants, medical electronics, mobile computing devices, servers, solid state drives, non-mobile computing devices and other devices. Semiconductor memory may comprise non-volatile memory or volatile memory. A non-volatile memory allows information to be stored and retained even when the non-volatile memory is not connected to a source of power (e.g., a battery).

One type of non-volatile memory has strings of non-volatile memory cells that have a select transistor at each end of the string. Typically, such strings are referred to as NAND strings. A NAND string may have a drain side select transistor at one end that connects the string to a bit line. A NAND string may have a source side select transistor at one end that connects the string to a source line. The non-volatile memory cells may also be referred to as non-volatile memory cell transistors, with the channels of the non-volatile memory cell transistors collectively being referred to as a NAND string channel.

BRIEF DESCRIPTION OF THE DRAWINGS

Like-numbered elements refer to common components in the different figures.

FIGS. 2A-B are block diagrams depicting embodiments of a memory system.

FIG. 4A is a block diagram of a memory structure having two planes.

DETAILED DESCRIPTION

Techniques are provided for operating non-volatile memory arrays that include NAND strings (e.g., each NAND string including a plurality of data memory cells coupled to a plurality of data word lines). Resistance of one or more dummy memory cells that are connected in series with data memory cells in a NAND string may be controlled for a read operation. For example, a lower dummy word line voltage may be applied during a read operation than during a verify operation so that some additional resistance is provided by the dummy memory cell(s) during reading compared with during verify. The additional resistance may provide a narrower threshold voltage distribution than if the same dummy word line voltage was used as for verify. The lower dummy word line voltage may be selectively used (e.g., only when reading some word lines). The dummy word line voltage may be selected to tune dummy memory cell voltage to achieve a desired result (e.g., desired threshold voltage distribution tightening). Resistance may also be controlled by adding charge to dummy memory cells to increase threshold voltages (e.g., by performing a programming-type operation on dummy memory cells prior to reading data memory cells).

Figure 1:
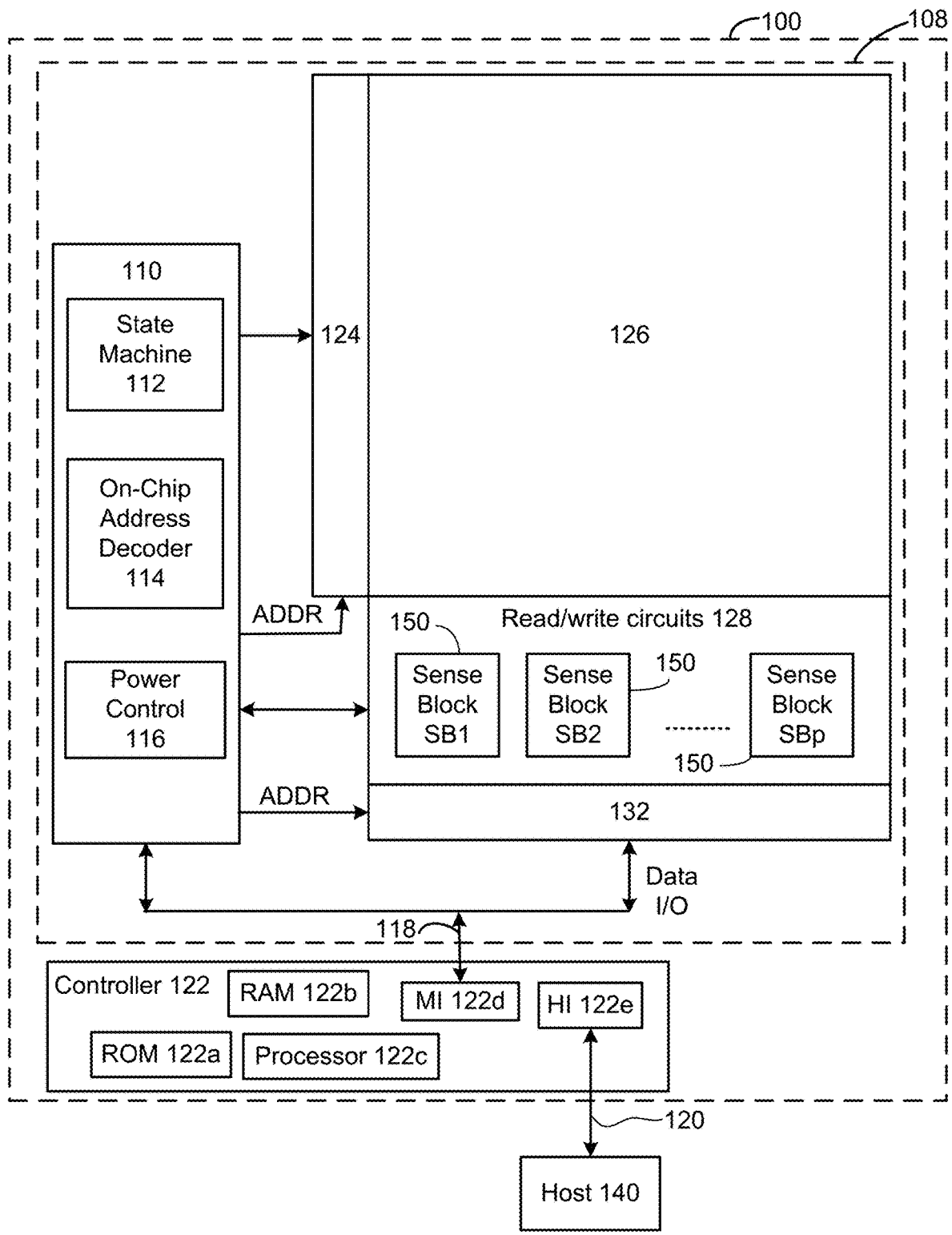
FIG. 1 is a functional block diagram of a memory device.

FIG. 1-FIG. 4D describe examples of memory systems that can be used to implement the technology proposed herein. FIG. 1 is a functional block diagram of an example memory system 100. The components depicted in FIG. 1 are electrical circuits. Memory system 100 includes one or more memory dies 108. The one or more memory dies 108 can be complete memory dies or partial memory dies. In one embodiment, each memory die 108 includes a memory structure 126, control circuit 110, and read/write circuits 128. Memory structure 126 is addressable by word lines via a row decoder 124 and by bit lines via a column decoder 132. The read/write/erase circuits 128 include multiple sense blocks 150 including SB1, SB2, SBp (sensing circuitry) and allow a page of memory cells to be read or programmed in parallel. Also, many strings of memory cells can be erased in parallel.

In some systems, a controller 122 is included in the same package (e.g., a removable storage card) as the one or more memory die 108. However, in other systems, the controller can be separated from the memory die 108. In some embodiments the controller will be on a different die than the memory die 108. In some embodiments, one controller 122 will communicate with multiple memory die 108. In other embodiments, each memory die 108 has its own controller. Commands and data are transferred between a host 140 and controller 122 via a data bus 120, and between controller 122 and the one or more memory die 108 via lines 118. In one embodiment, memory die 108 includes a set of input and/or output (I/O) pins that connect to lines 118.

Control circuit 110 cooperates with the read/write circuits 128 to perform memory operations (e.g., write, read, erase and others) on memory structure 126, and includes state machine 112, an on-chip address decoder 114, and a power control circuit 116. In one embodiment, control circuit 110 includes buffers such as registers, ROM fuses and other storage devices for storing default values such as base voltages and other parameters.

The on-chip address decoder 114 provides an address interface between addresses used by host 140 or controller 122 to the hardware address used by the decoders 124 and 132. Power control circuit 116 controls the power and voltages supplied to the word lines, bit lines, and select lines during memory operations. The power control circuit 116 includes voltage circuitry, in one embodiment. Power control circuit 116 may include charge pumps for creating voltages. The sense blocks include bit line drivers. The power control circuit 116 executes under control of the state machine 112, in one embodiment.

State machine 112 and/or controller 122 (or equivalently functioned circuits), in combination with all or a subset of the other circuits depicted in FIG. 1, can be considered a control circuit that performs various functions described herein. The control circuit can include hardware only or a combination of hardware and software (including firmware). For example, a controller programmed by firmware to perform the functions described herein is one example of a control circuit. A control circuit can include a processor, PGA (Programmable Gate Array, FPGA (Field Programmable Gate Array), ASIC (Application Specific Integrated Circuit), integrated circuit or other type of circuit.

The (on-chip or off-chip) controller 122 (which in one embodiment is an electrical circuit) may comprise one or more processors 122c, ROM 122a, RAM 122b, a memory interface (MI) 122d and a host interface (HI) 122e, all of which are interconnected. The storage devices (ROM 122a, RAM 122b) store code (software) such as a set of instructions (including firmware), and one or more processors 122c is/are operable to execute the set of instructions to provide the functionality described herein. Alternatively, or additionally, one or more processors 122c can access code from a storage device in the memory structure, such as a reserved area of memory cells connected to one or more word lines. RAM 122b can be to store data for controller 122, including caching program data (discussed below). Memory interface 122d, in communication with ROM 122a, RAM 122b and processor 122c, is an electrical circuit that provides an electrical interface between controller 122 and one or more memory die 108. For example, memory interface 122d can change the format or timing of signals, provide a buffer, isolate from surges, latch I/O, etc. One or more processors 122c can issue commands to control circuit 110 (or another component of memory die 108) via Memory Interface 122d. Host interface 122e provides an electrical interface with host 140 data bus 120 in order to receive commands, addresses and/or data from host 140 to provide data and/or status to host 140.

In one embodiment, memory structure 126 comprises a three-dimensional memory array of non-volatile memory cells in which multiple memory levels are formed above a single substrate, such as a wafer. The memory structure may comprise any type of non-volatile memory that are monolithically formed in one or more physical levels of arrays of memory cells having an active area disposed above a silicon (or other type of) substrate. In one example, the non-volatile memory cells comprise vertical NAND strings with charge-trapping material.

In another embodiment, memory structure 126 comprises a two-dimensional memory array of non-volatile memory cells. In one example, the non-volatile memory cells are NAND flash memory cells utilizing floating gates. Other types of memory cells (e.g., NOR-type flash memory) can also be used. The exact type of memory array architecture or memory cell included in memory structure 126 is not limited to the examples above.

Figure 2A:
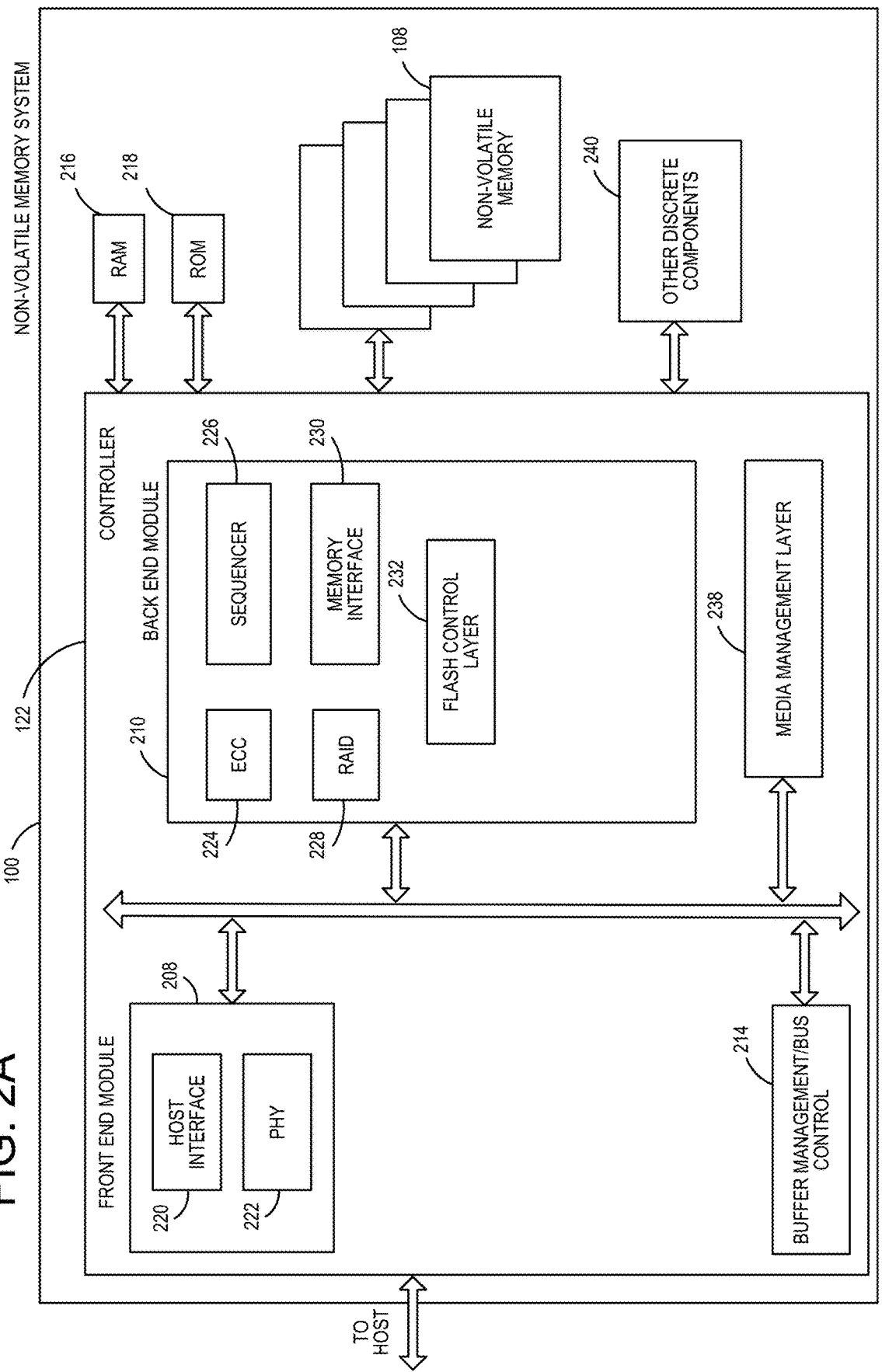

FIG. 2A is a block diagram of example memory system 100, depicting more details of one embodiment of controller 122. The controller in FIG. 2A is a flash memory controller but note that the non-volatile memory die 108 is not limited to flash. Thus, the controller 122 is not limited to the example of a flash memory controller. As used herein, a flash memory controller is a device that manages data stored on flash memory and communicates with a host, such as a computer or electronic device. A flash memory controller can have various functionality in addition to the specific functionality described herein. For example, the flash memory controller can format the flash memory to ensure the memory is operating properly, map out bad flash memory cells, and allocate spare memory cells to be substituted for future failed cells. Some part of the spare cells can be used to hold firmware to operate the flash memory controller and implement other features. In operation, when a host needs to read data from or write data to the flash memory, it will communicate with the flash memory controller. If the host provides a logical address to which data is to be read/written, the flash memory controller can convert the logical address received from the host to a physical address in the flash memory. (Alternatively, the host can provide the physical address). The flash memory controller can also perform various memory management functions, such as, but not limited to, wear leveling (distributing writes to avoid wearing out specific blocks of memory that would otherwise be repeatedly written to) and garbage collection (after a block is full, moving only the valid pages of data to a new block, so the full block can be erased and reused).

The interface between controller 122 and non-volatile memory die 108 may be any suitable flash interface, such as Toggle Mode 200, 400, or 800. In one embodiment, memory system 100 may be a card-based system, such as a secure digital (SD) or a micro secure digital (micro-SD) card. In an alternate embodiment, memory system 100 may be part of an embedded memory system. For example, the flash memory may be embedded within the host. In other example, memory system 100 can be in the form of a solid state drive (SSD).

In some embodiments, non-volatile memory system 100 includes a single channel between controller 122 and non-volatile memory die 108, the subject matter described herein is not limited to having a single memory channel. For example, in some memory system architectures, 2, 4, 8 or more channels may exist between the controller and the memory die, depending on controller capabilities. In any of the embodiments described herein, more than a single channel may exist between the controller and the memory die, even if a single channel is shown in the drawings.

As depicted in FIG. 2A, controller 122 includes a front end module 208 that interfaces with a host, a back end module 210 that interfaces with the one or more non-volatile memory die 108, and various other modules that perform functions which will now be described in detail.

The components of controller 122 depicted in FIG. 2A may take the form of a packaged functional hardware unit (e.g., an electrical circuit) designed for use with other components, a portion of a program code (e.g., software or firmware) executable by a (micro) processor or processing circuitry that usually performs a particular function of related functions, or a self-contained hardware or software component that interfaces with a larger system, for example. For example, each module may include an application specific integrated circuit (ASIC), a Field Programmable Gate Array (FPGA), a circuit, a digital logic circuit, an analog circuit, a combination of discrete circuits, gates, or any other type of hardware or combination thereof. Alternatively, or in addition, each module may include software stored in a processor readable device (e.g., memory) to program a processor for controller 122 to perform the functions described herein. The architecture depicted in FIG. 2A is one example implementation that may (or may not) use the components of controller 122 depicted in FIG. 1 (i.e., RAM, ROM, processor, interface).

Referring again to modules of the controller 122, a buffer manager/bus control 214 manages buffers in random access memory (RAM) 216 and controls the internal bus arbitration of controller 122. A read only memory (ROM) 218 stores system boot code. Although illustrated in FIG. 2A as located separately from the controller 122, in other embodiments one or both of the RAM 216 and ROM 218 may be located within the controller. In yet other embodiments, portions of RAM and ROM may be located both within the controller 122 and outside the controller. Further, in some implementations, the controller 122, RAM 216, and ROM 218 may be located on separate semiconductor die.

Front end module 208 includes a host interface 220 and a physical layer interface (PHY) 222 that provide the electrical interface with the host or next level storage controller. The choice of the type of host interface 220 can depend on the type of memory being used. Examples of host interfaces 220 include, but are not limited to, SATA, SATA Express, SAS, Fibre Channel, USB, PCIe, and NVMe. The host interface 220 typically facilitates transfer for data, control signals, and timing signals.

Back end module 210 includes an error correction code (ECC) engine 224 that encodes the data bytes received from the host and decodes and error corrects the data bytes read from the non-volatile memory. A command sequencer 226 generates command sequences, such as program and erase command sequences, to be transmitted to non-volatile memory die 108. A RAID (Redundant Array of Independent Dies) module 228 manages generation of RAID parity and recovery of failed data. The RAID parity may be used as an additional level of integrity protection for the data being written into the non-volatile memory system 100. In some cases, the RAID module 228 may be a part of the ECC engine 224. Note that the RAID parity may be added as an extra die or dies as implied by the common name, but it may also be added within the existing die, e.g., as an extra plane, or extra block, or extra WLs within a block. A memory interface 230 provides the command sequences to non-volatile memory die 108 and receives status information from non-volatile memory die 108. In one embodiment, memory interface 230 may be a double data rate (DDR) interface, such as a Toggle Mode 200, 400, or 800 interface. A flash control layer 232 controls the overall operation of back end module 210.

Additional components of memory system 100 illustrated in FIG. 2A include media management layer 238, which performs wear leveling of memory cells of non-volatile memory die 108. Memory system 100 also includes other discrete components 240, such as external electrical interfaces, external RAM, resistors, capacitors, or other components that may interface with controller 122. In alternative embodiments, one or more of the physical layer interface 222, RAID module 228, media management layer 238 and buffer management/bus controller 214 are optional components that are not necessary in the controller 122.

The Flash Translation Layer (FTL) or Media Management Layer (MML) 238 may be integrated as part of the flash management that may handle flash errors and interfacing with the host. In particular, MML may be a module in flash management and may be responsible for the internals of NAND management. In particular, the MML 238 may include an algorithm in the memory device firmware which translates writes from the host into writes to the memory 126 of memory die 108. The MML 238 may be needed because: 1) the memory may have limited endurance; 2) the memory 126 may only be written in multiples of pages; and/or 3) the memory 126 may not be written unless it is erased as a block (or a tier within a block in some embodiments). The MML 238 understands these potential limitations of the memory 126 which may not be visible to the host. Accordingly, the MML 238 attempts to translate the writes from host into writes into the memory 126.

Controller 122 may interface with one or more memory dies 108. In one embodiment, controller 122 and multiple memory dies (together comprising non-volatile memory system 100) implement a solid state drive (SSD), which can emulate, replace or be used instead of a hard disk drive inside a host, as a NAS device, in a laptop, in a tablet, in a server, etc. Additionally, the SSD need not be made to work as a hard drive.

Some embodiments of a non-volatile storage system will include one memory die 108 connected to one controller 122. However, other embodiments may include multiple memory die 108 in communication with one or more controllers 122. In one example, the multiple memory die can be grouped into a set of memory packages. Each memory package includes one or more memory die in communication with controller 122. In one embodiment, a memory package includes a printed circuit board (or similar structure) with one or more memory die mounted thereon. In some embodiments, a memory package can include molding material to encase the memory dies of the memory package. In some embodiments, controller 122 is physically separate from any of the memory packages.

In one embodiment, the control circuit(s) (e.g., control circuits 110) are formed on a first die, referred to as a control die, and the memory array (e.g., memory structure 126) is formed on a second die, referred to as a memory die. For example, some or all control circuits (e.g., control circuit 110, row decoder 124, column decoder 132, and read/write circuits 128) associated with a memory may be formed on the same control die. A control die may be bonded to one or more corresponding memory die to form an integrated memory assembly. The control die and the memory die may have bond pads arranged for electrical connection to each other. Bond pads of the control die and the memory die may be aligned and bonded together by any of a variety of bonding techniques, depending in part on bond pad size and bond pad spacing (i.e., bond pad pitch). In some embodiments, the bond pads are bonded directly to each other, without solder or other added material, in a so-called Cu-to-Cu bonding process. In some examples, dies are bonded in a one-to-one arrangement (e.g., one control die to one memory die). In some examples, there may be more than one control die and/or more than one memory die in an integrated memory assembly. In some embodiments, an integrated memory assembly includes a stack of multiple control die and/or multiple memory die. In some embodiments, the control die is connected to, or otherwise in communication with, a memory controller. For example, a memory controller may receive data to be programmed into a memory array. The memory controller will forward that data to the control die so that the control die can program that data into the memory array on the memory die.

FIG. 2B shows an alternative arrangement to that of FIG. 2A which may be implemented using wafer-to-wafer bonding to provide a bonded die pair. FIG. 2B depicts a functional block diagram of one embodiment of an integrated memory assembly 307. One or more integrated memory assemblies 307 may be used in a memory package in memory system 100. The integrated memory assembly 307 includes two types of semiconductor die (or more succinctly, "die"). Memory die 301 includes memory array 326 (memory structure 326, which may be any suitable memory as described with respect to memory structure 126). Memory array 326 may contain non-volatile memory cells.

Control die 311 includes column control circuitry 364, row control circuitry 320 and system control logic 360 (including state machine 312, power control module 316, storage 366, and memory interface 368). In some embodiments, control die 311 is configured to connect to the memory array 326 in the memory die 301. FIG. 2B shows an example of the peripheral circuitry, including control circuits, formed in a peripheral circuit or control die 311 coupled to memory array 326 formed in memory die 301. System control logic 360, row control circuitry 320, and column control circuitry 364 are located in control die 311. In some embodiments, all or a portion of the column control circuitry 364 and all or a portion of the row control circuitry 320 are located on the memory die 301. In some embodiments, some of the circuitry in the system control logic 360 is located on the on the memory die 301.

System control logic 360, row control circuitry 320, and column control circuitry 364 may be formed by a common process (e.g., CMOS process), so that adding elements and functionalities, such as ECC, more typically found on a memory controller 102 may require few or no additional process steps (i.e., the same process steps used to fabricate controller 102 may also be used to fabricate system control logic 360, row control circuitry 320, and column control circuitry 364). Thus, while moving such circuits from a die such as memory die 301 may reduce the number of steps needed to fabricate such a die, adding such circuits to a die such as control die 311 may not require many additional process steps.

FIG. 2B shows column control circuitry 364 including sense block(s) 350 on the control die 311 coupled to memory array 326 on the memory die 301 through electrical paths 370. For example, electrical paths 370 may provide electrical connection between column decoder 332, driver circuitry 372, and block select 373 and bit lines of memory array (or memory structure) 326. Electrical paths may extend from column control circuitry 364 in control die 311 through pads on control die 311 that are bonded to corresponding pads of the memory die 301, which are connected to bit lines of memory structure 326. Each bit line of memory structure 326 may have a corresponding electrical path in electrical paths 370, including a pair of bond pads, which connects to column control circuitry 364. Similarly, row control circuitry 320, including row decoder 324, array drivers 374, and block select 376 are coupled to memory array 326 through electrical paths 308. Each of electrical path 308 may correspond to a word line, dummy word line, or select gate line. Additional electrical paths may also be provided between control die 311 and memory die 301.

In some embodiments, there is more than one control die 311 and/or more than one memory die 301 in an integrated memory assembly 307. In some embodiments, the integrated memory assembly 307 includes a stack of multiple control die 311 and multiple memory dies 301. In some embodiments, each control die 311 is affixed (e.g., bonded) to at least one of the memory dies 301.

The exact type of memory array architecture or memory cell included in memory structure 326 is not limited to the examples above. Many different types of memory array architectures or memory cell technologies can be used to form memory structure 326. No particular non-volatile memory technology is required for purposes of the new claimed embodiments proposed herein. Other examples of suitable technologies for memory cells of the memory structure 326 include ReRAM memories, magnetoresistive memory (e.g., MRAM, Spin Transfer Torque MRAM, Spin Orbit Torque MRAM), phase change memory (e.g., PCM), and the like. Examples of suitable technologies for architectures of memory structure 326 include two dimensional arrays, three dimensional arrays, cross-point arrays, stacked two dimensional arrays, vertical bit line arrays, and the like.

One example of a ReRAM, or PCMRAM, cross point memory includes reversible resistance-switching elements arranged in cross point arrays accessed by X lines and Y lines (e.g., word lines and bit lines). In another embodiment, the memory cells may include conductive bridge memory elements. A conductive bridge memory element may also be referred to as a programmable metallization cell. A conductive bridge memory element may be used as a state change element based on the physical relocation of ions within a solid electrolyte. In some cases, a conductive bridge memory element may include two solid metal electrodes, one relatively inert (e.g., tungsten) and the other electrochemically active (e.g., silver or copper), with a thin film of the solid electrolyte between the two electrodes. As temperature increases, the mobility of the ions also increases causing the programming threshold for the conductive bridge memory cell to decrease. Thus, the conductive bridge memory element may have a wide range of programming thresholds over temperature.

Magnetoresistive memory (MRAM) stores data by magnetic storage elements. The elements are formed from two ferromagnetic plates, each of which can hold a magnetization, separated by a thin insulating layer. One of the two plates is a permanent magnet set to a particular polarity; the other plate's magnetization can be changed to match that of an external field to store memory. A memory device is built from a grid of such memory cells. In one embodiment for programming, each memory cell lies between a pair of write lines arranged at right angles to each other, parallel to the cell, one above and one below the cell. When current is passed through them, an induced magnetic field is created.

Phase change memory (PCM) exploits the unique behavior of chalcogenide glass. One embodiment uses a GeTe—Sb2Te3 super lattice to achieve non-thermal phase changes by simply changing the co-ordination state of the Germanium atoms with a laser pulse (or light pulse from another source). Therefore, the doses of programming are laser pulses. The memory cells can be inhibited by blocking the memory cells from receiving the light. Note that the use of "pulse" in this document does not require a square pulse, but includes a (continuous or non-continuous) vibration or burst of sound, current, voltage light, or other wave.

A person of ordinary skill in the art will recognize that the technology described herein is not limited to a single specific memory structure, but covers many relevant memory structures within the spirit and scope of the technology as described herein and as understood by one of ordinary skill in the art.

Figure 3:
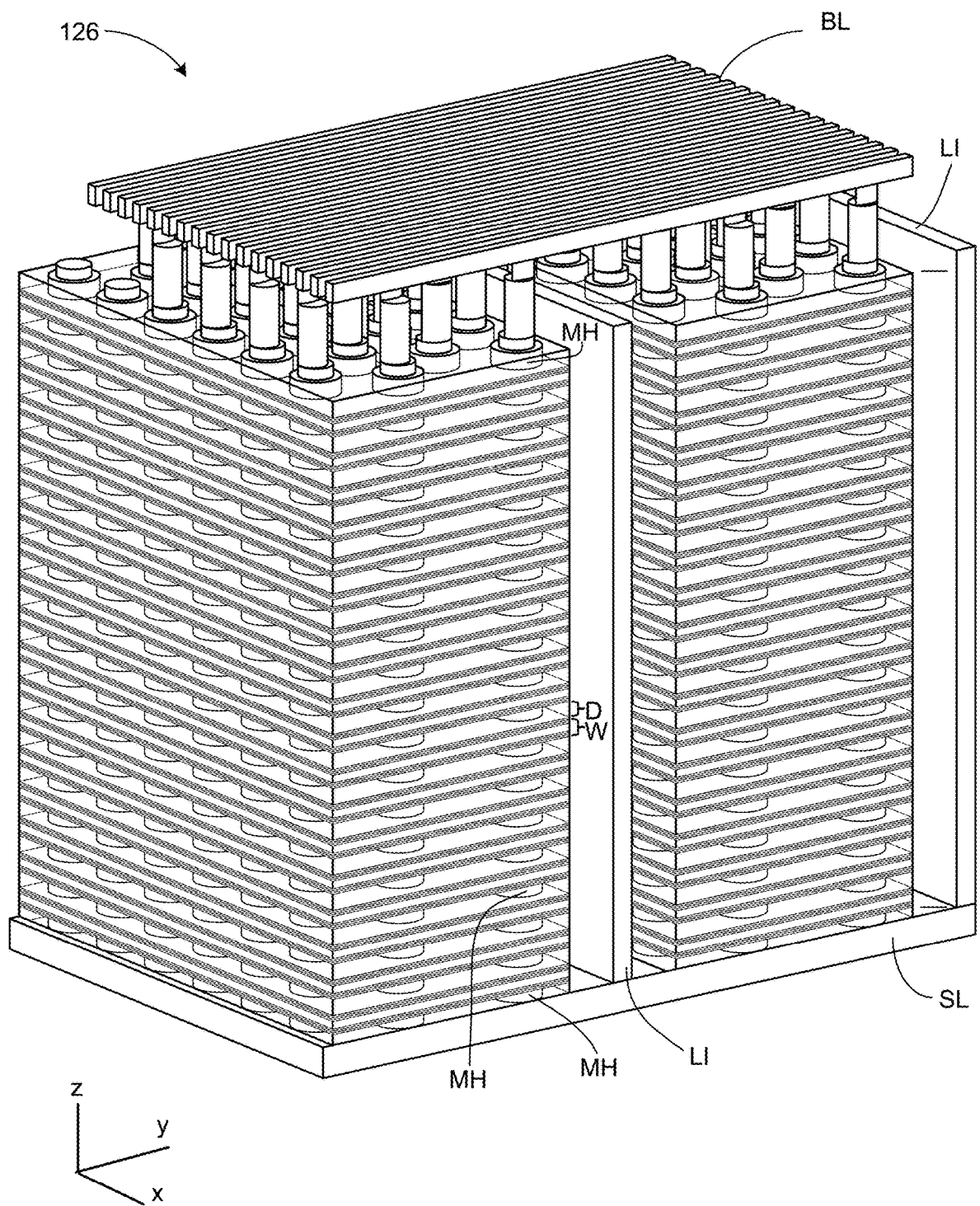
FIG. 3 is a perspective view of a portion of one embodiment of a monolithic three dimensional memory structure.

FIG. 3 is a perspective view of a portion of one example embodiment of a monolithic three dimensional memory array that can comprise memory structure 126 or 326, which includes a plurality non-volatile memory cells. For example, FIG. 3 shows a portion of one block of memory. The structure depicted includes a set of bit lines BL positioned above a stack of alternating dielectric layers and conductive layers. For example, one of the dielectric layers is marked as D and one of the conductive layers (also called word line layers) is marked as W. The number of alternating dielectric layers and conductive layers can vary based on specific implementation requirements. One set of embodiments includes between 108-300 alternating dielectric layers and conductive layers. One example embodiment includes 96 data word line layers, 8 select layers, 6 dummy word line layers and 110 dielectric layers. More or less than 108-300 layers can also be used. Data word line layers have data memory cells. Dummy word line layers have dummy memory cells. As will be explained below, the alternating dielectric layers and conductive layers are divided into four "fingers" by local interconnects LI. FIG. 3 shows two fingers and two local interconnects LI. Below the alternating dielectric layers and word line layers is a source line layer SL. Memory holes are formed in the stack of alternating dielectric layers and conductive layers. For example, one of the memory holes is marked as MH. Note that in FIG. 3, the dielectric layers are depicted as see-through so that the reader can see the memory holes positioned in the stack of alternating dielectric layers and conductive layers. In one embodiment, NAND strings are formed by filling the memory hole with materials including a charge-trapping material to create a vertical column of memory cells. Each memory cell can store one or more bits of data. More details of the three dimensional monolithic memory array that comprises memory structure 126 or 326 are provided below with respect to FIGS. 4A-4D.

FIG. 4A is a block diagram explaining one example organization of memory structure 126 or 326, which is divided into two planes 302 and 304. Each plane is then divided into M blocks. In one example, each plane has about 2000 blocks. However, different numbers of blocks and planes can also be used. In on embodiment, a block of memory cells is a unit of erase. That is, all memory cells of a block are erased together. In other embodiments, memory cells can be grouped into blocks for other reasons, such as to organize the memory structure 126 to enable the signaling and selection circuits. In some embodiments, a block represents a groups of connected memory cells as the memory cells of a block share a common set of word lines.

Figure 4B:
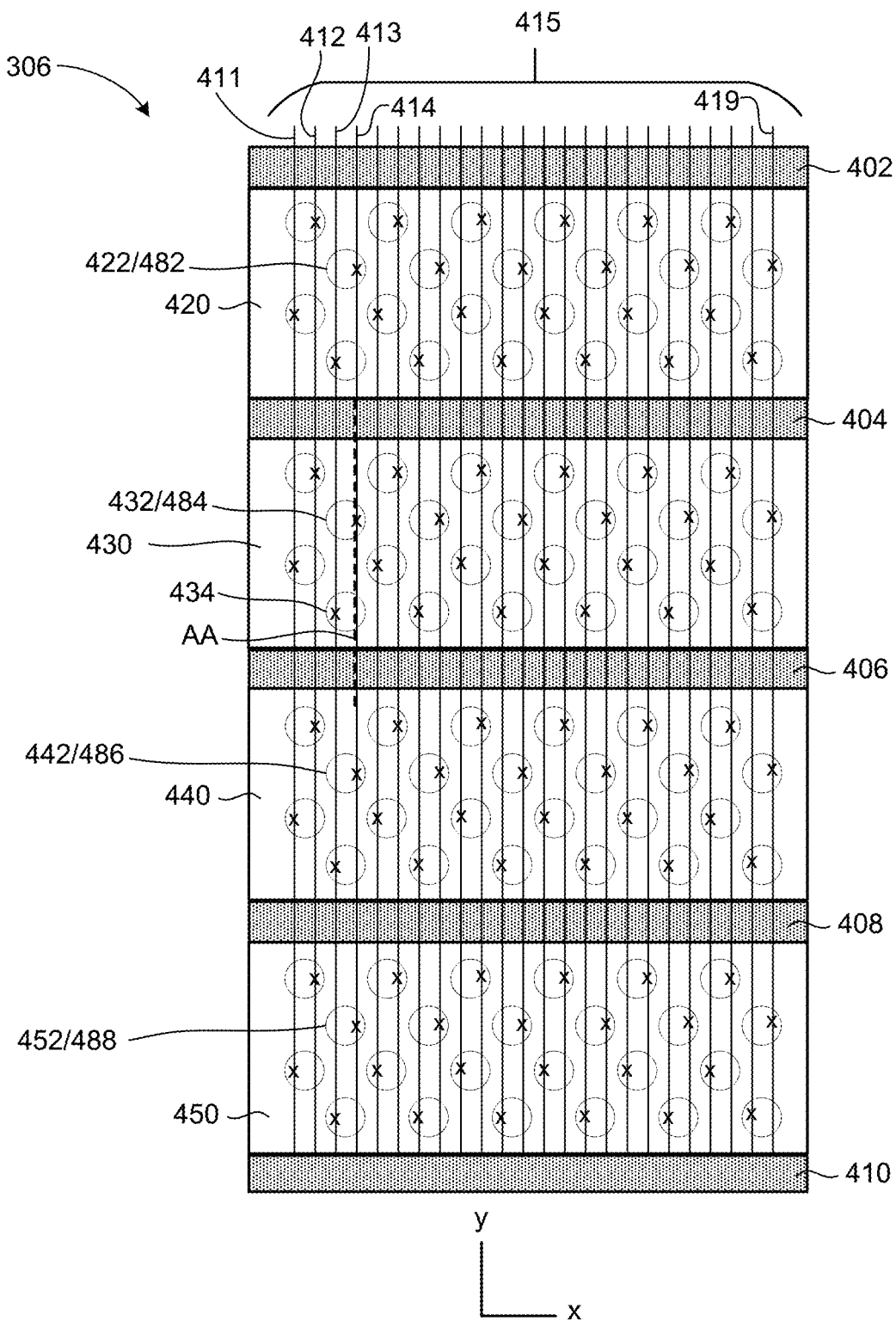
FIG. 4B depicts a top view of a portion of a block of memory cells.
Figure 4C:
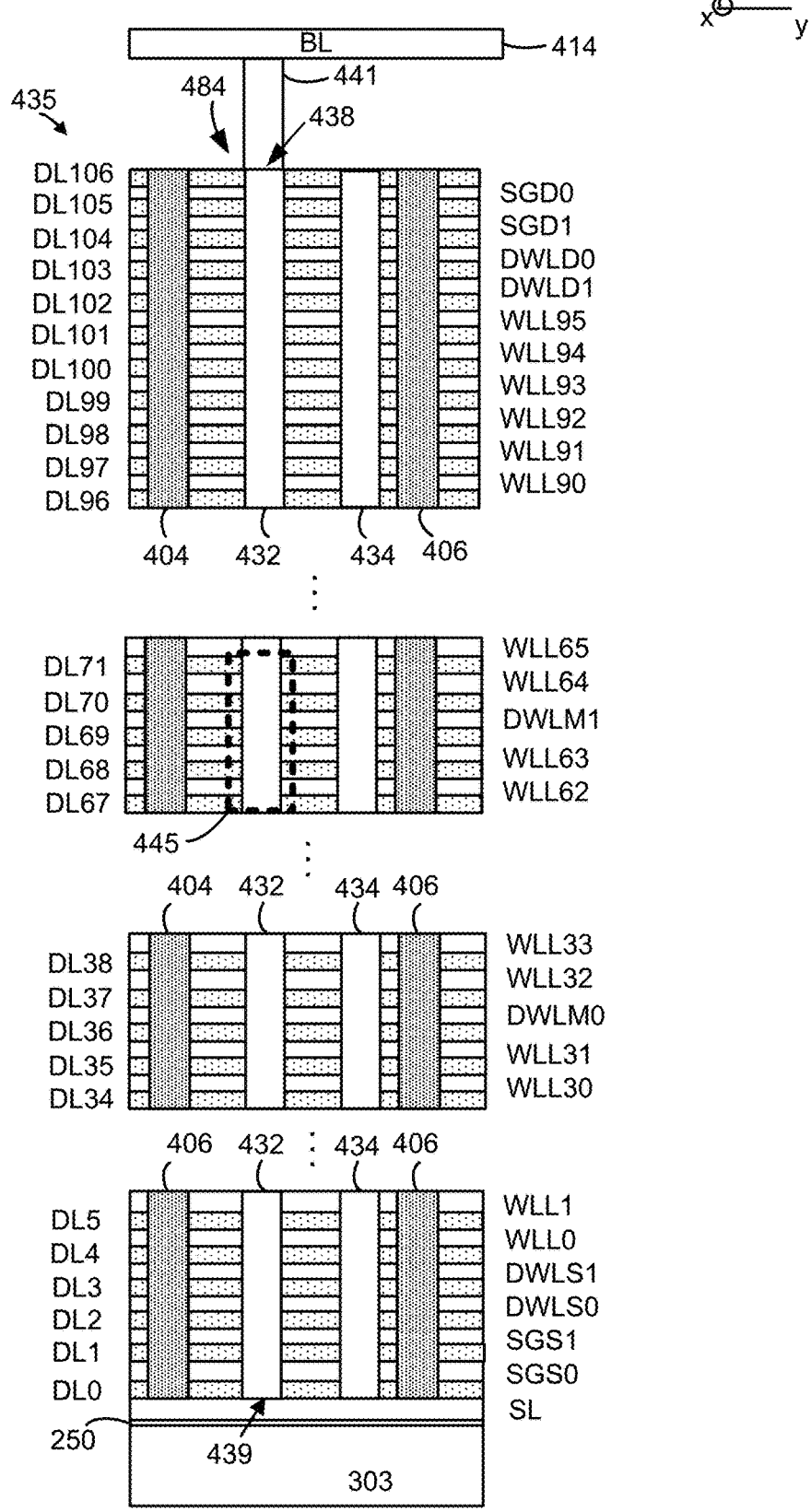
FIG. 4C depicts an embodiment of a stack showing a cross-sectional view along line AA of FIG. 4B.
Figure 4D:
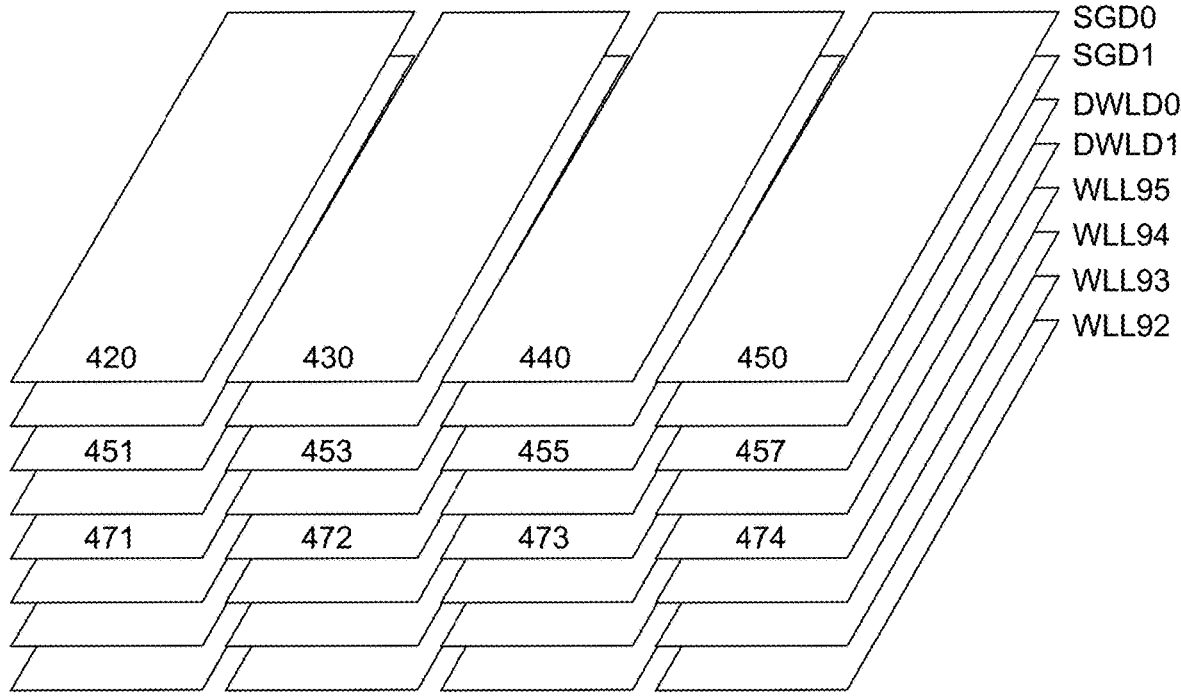
FIG. 4D depicts an alternative view of the select gate layers and word line layers of the stack 435 of FIG. 4C.
Figure 4D:
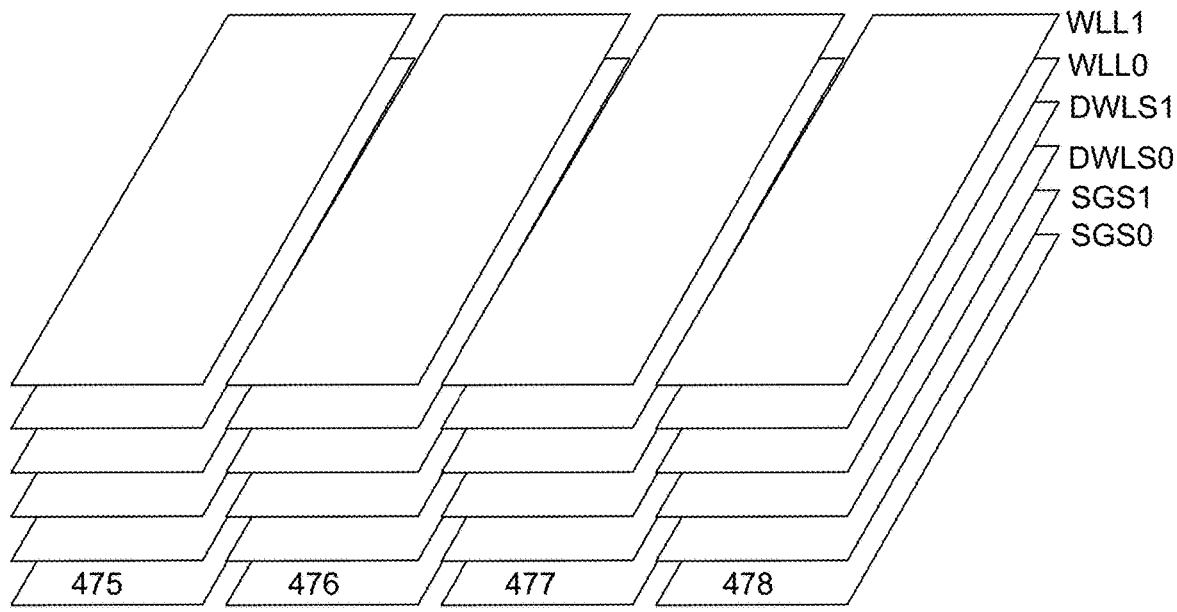

FIGS. 4B-4D depict an example three dimensional ("3D") NAND structure that corresponds to the structure of FIG. 3 and can be used to implement memory structure 126 of FIG. 2A or 326 of FIG. 2B. FIG. 4B is a block diagram depicting a top view of a portion of one block from memory structure 126. The portion of the block depicted in FIG. 4B corresponds to portion 306 in block 2 of FIG. 4A. In one embodiment, the memory array has many layers; however, FIG. 4B only shows the top layer.

FIG. 4B depicts a plurality of circles that represent the vertical columns. Each of the vertical columns include multiple select transistors (also referred to as a select gate or selection gate) and multiple memory cells. In one embodiment, each vertical column implements a NAND string. For example, FIG. 4B depicts vertical columns 422, 432, 442 and 452. Vertical column 422 implements NAND string 482. Vertical column 432 implements NAND string 484. Vertical column 442 implements NAND string 486. Vertical column 452 implements NAND string 488. More details of the vertical columns are provided below. Since the block depicted in FIG. 4B extends in the direction of arrow 333, the block includes more vertical columns than depicted in FIG. 4B.

FIG. 4B also depicts a set of bit lines 415, including bit lines 411, 412, 413, 414, . . . 419. FIG. 4B shows twenty-four bit lines because only a portion of the block is depicted. It is contemplated that more than twenty-four bit lines connected to vertical columns of the block. Each of the circles representing vertical columns has an "x" to indicate its connection to one bit line. For example, bit line 414 is connected to vertical columns 422, 432, 442 and 452.

The block depicted in FIG. 4B includes a set of local interconnects 402, 404, 406, 408 and 410 that connect the various layers to a source line below the vertical columns. Local interconnects 402, 404, 406, 408 and 410 also serve to divide each layer of the block into four regions; for example, the top layer depicted in FIG. 4B is divided into regions 420, 430, 440 and 450, which are referred to as fingers. In the layers of the block that implement memory cells, the four regions are referred to as word line fingers that are separated by the local interconnects. In one embodiment, the word line fingers on a common level of a block connect together to form a single word line. In another embodiment, the word line fingers on the same level are not connected together. In one example implementation, a bit line only connects to one vertical column in each of regions 420, 430, 440 and 450. In that implementation, each block has sixteen rows of active columns, and each bit line connects to four rows in each block. In one embodiment, all of four rows connected to a common bit line are connected to the same word line (via different word line fingers on the same level that are connected together); therefore, the system uses the source side selection lines and the drain side selection lines to choose one (or another subset) of the four to be subjected to a memory operation (program, verify, read, and/or erase).

Although FIG. 4B shows each region having four rows of vertical columns, four regions and sixteen rows of vertical columns in a block, those exact numbers are an example implementation. Other embodiments may include more or less regions per block, more or less rows of vertical columns per region and more or less rows of vertical columns per block.

FIG. 4B also shows the vertical columns being staggered. In other embodiments, different patterns of staggering can be used. In some embodiments, the vertical columns are not staggered.

FIG. 4C depicts an embodiment of a stack 435 showing a cross-sectional view along line AA of FIG. 4B. Two SGD layers (SGD0, SDG1), two SGS layers (SGS0, SGS1) and six dummy word line layers DWLD0, DWLD1, DWLM1, DWLM0, DWLS0 and DWLS1 are provided, in addition to the data word line layers WLL0-WLL95. Each NAND string has a drain side select transistor at the SGD0 layer and a drain side select transistor at the SGD1 layer. In operation, the same voltage may be applied to each layer (SGD0, SGD1), such that the control terminal of each transistor receives the same voltage. Each NAND string has a source side select transistor at the SGS0 layer and a drain side select transistor at the SGS1 layer. In operation, the same voltage may be applied to each layer (SGS0, SGS1), such that the control terminal of each transistor receives the same voltage. Also depicted are dielectric layers DL0-DL106.

Columns 432, 434 of memory cells are depicted in the multi-layer stack. The stack includes a substrate 303, an insulating film 250 on the substrate, and a portion of a source line SL. A portion of the bit line 414 is also depicted. Note that NAND string 484 is connected to the bit line 414. NAND string 484 has a source-end 439 at a bottom of the stack and a drain-end 438 at a top of the stack. The source-end 439 is connected to the source line SL. A conductive via 441 connects the drain-end 438 of NAND string 484 to the bit line 414. The local interconnects 404 and 406 from FIG. 4B are also depicted.

FIG. 4D depicts an alternative view of the SG layers and word line layers of the stack 435 of FIG. 4C. The SGD layers SGD0 and SGD0 (the drain-side SG layers) each includes parallel rows of SG lines associated with the drain-side of a set of NAND strings. For example, SGD0 includes drain-side SG regions 420, 430, 440 and 450, consistent with FIG. 4B.

Below the SGD layers are the drain-side dummy word line layers. Each dummy word line layer represents a word line, in one approach, and is connected to a set of dummy memory cells at a given height in the stack. For example, DWLD0 comprises word line layer regions 451, 453, 455 and 457. A dummy memory cell, also referred to as a non-data memory cell, does not store data and is ineligible to store data, while a data memory cell is eligible to store data.

Below the dummy word line layers are the data word line layers. For example, WLL95 comprises word line layer regions 471, 472, 473 and 474.

Below the data word line layers are the source-side dummy word line layers DWLS0 and DWLS1. Each source-side dummy word line can be independently controlled, in one approach (e.g., different voltages may be applied to DWLS0 and DWLS1). Alternatively, the source-side dummy word lines may be connected and commonly controlled (e.g., same voltage may be applied to DWLS0 and DWLS1)

Below the source-side dummy word line layers are the SGS layers. The SGS layers SGS0 and SGS1 (the source-side SG layers) each includes parallel rows of SG lines associated with the source-side of a set of NAND strings. For example, SGS0 includes source-side SG lines 475, 476, 477 and 478 as shown in FIG. 4D. Each SG line can be independently controlled, in one approach. Or the SG lines can be connected and commonly controlled.

When a data memory cell transistor is programmed, electrons are stored in a portion of the charge-trapping layer which is associated with the data memory cell transistor. These electrons are drawn into the charge-trapping layer from the channel, and through the tunneling layer. The Vth of a data memory cell transistor is increased in proportion to the amount of stored charge. During an erase operation, the electrons return to the channel.

Non-data transistors (e.g., select transistors, dummy memory cell transistors) may also include the charge trapping layer 463. Thus, the threshold voltage of at least some non-data transistors may also be adjusted by storing or removing electrons from the charge trapping layer 463 (e.g., the resistance of non-data transistors, including dummy memory cells, may be adjusted by storing or removing electrons). It is not required that all non-data transistors have an adjustable Vth. For example, the charge trapping layer 463 is not required to be present in every select transistor.

Each of the memory holes can be filled with a plurality of annular layers comprising a blocking oxide layer, a charge trapping layer, a tunneling layer and a channel layer. A core region of each of the memory holes is filled with a body material, and the plurality of annular layers are between the core region and the WLLs in each of the memory holes.

In some cases, the tunneling layer 464 can comprise multiple layers such as in an oxide-nitride-oxide configuration.

Although the example memory system of FIGS. 3-4D is a three dimensional memory structure that includes vertical NAND strings with charge-trapping material, other (2D and 3D) memory structures can also be used with the technology described herein (e.g., other memory structures with NAND strings including a plurality of data memory cells coupled to a plurality of data word lines in series with a plurality of dummy memory cells connected to a plurality of dummy word lines). Different operations for accessing data in non-volatile memory cells (e.g., read, program, and program verify) that are described below may be applied to one or more of the example memory systems described above with respect to FIGS. 1-4D.

Typically, the program voltage applied to the control gates (via a selected word line) during a program operation is applied as a series of program pulses. Between programming pulses of program steps are a set of verify pulses to perform verification in verify steps (e.g., alternating program steps and verify steps in a program operation). In many implementations, the magnitude of the program pulses is increased with each successive pulse by a predetermined step size.

In one embodiment, the group of memory cells selected to be programmed (referred to herein as the selected memory cells) are programmed concurrently and are all connected to the same word line (the selected word line). There will likely be other memory cells that are not selected for programming (unselected memory cells) that are also connected to the selected word line. That is, the selected word line will also be connected to memory cells that are supposed to be inhibited from programming. For example, when data is written to a set of memory cells, some of the memory cells will need to store data associated with an erased state so they will not be programmed. Additionally, as memory cells reach their intended target data state, they will be inhibited from further programming. Those NAND strings (e.g., unselected NAND strings) that include memory cells connected to the selected word line that are to be inhibited from programming have their channels boosted to inhibit programming. When a channel has a boosted voltage, the voltage differential between the channel and the word line is not large enough to cause programming.

Figure 5A:
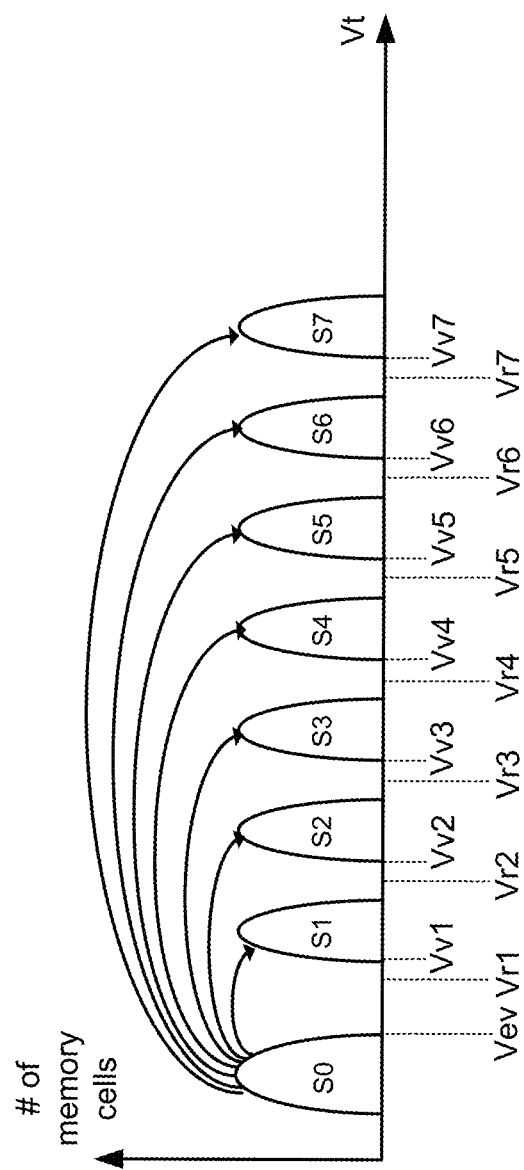
FIGS. 5A-B illustrate aspects of programming operations according to an example.

FIG. 5A shows threshold voltage distributions for eight data states, S0 to S7, corresponding to three bits of data per cell (Three Level Cell, or TLC). Also shown are seven read reference voltages, Vr1, Vr2, Vr3, Vr4, Vr5, Vr6, and Vr7 for reading data from memory cells. By testing (e.g., performing sense operations) whether the threshold voltage of a given memory cell is above or below the seven read reference voltages, the system can determine what data state (i.e., S0, S1, S2, S3, . . . ) a memory cell is in.

FIG. 5A also shows seven verify reference voltages, Vv1, Vv2, Vv3, Vv4, Vv5, Vv6, and Vv7 used in read verify steps during a programming operation. When programming memory cells to data state S1, the system will test whether those memory cells have a threshold voltage greater than or equal to Vv1. When programming memory cells to data state S2, the system will test whether the memory cells have threshold voltages greater than or equal to Vv2. When programming memory cells to data state S3, the system will determine whether memory cells have their threshold voltage greater than or equal to Vv3. When programming memory cells to data state S4, the system will test whether those memory cells have a threshold voltage greater than or equal to Vv4. When programming memory cells to data state S5, the system will test whether those memory cells have a threshold voltage greater than or equal to Vv5. When programming memory cells to data state S6, the system will test whether those memory cells have a threshold voltage greater than or equal to Vv6. When programming memory cells to data state S7, the system will test whether those memory cells have a threshold voltage greater than or equal to Vv7. FIG. 5A also shows Vev, which is a voltage level to test whether a memory cell has been properly erased (e.g., whether a memory cell is in the S0 data state).

In one embodiment, known as full sequence programming, memory cells can be programmed from the erased data state S0 directly to any of the programmed data states S1-S7. For example, a population of memory cells to be programmed may first be erased so that all memory cells in the population are in erased data state S0. Then, a programming process is used to program memory cells directly into data states S1, S2, S3, S4, S5, S6, and/or S7. For example, while some memory cells are being programmed from data state S0 to data state S1, other memory cells are being programmed from data state S0 to data state S2 and/or from data state S0 to data state S3, and so on. The arrows of FIG. 5 represent the full sequence programming. In some embodiments, data states S1-S7 can overlap, with controller 122 relying on error correction to identify the correct data being stored. The technology described herein can also be used with other types of programming in addition to full sequence programming (including, but not limited to, multiple stage/phase programming).

In general, during sensing of verify and read operations, the selected word line is connected to a voltage (one example of a reference signal), a level of which is specified for each read operation (e.g., see read compare levels Vr1, Vr2, Vr3, Vr4, Vr5, Vr6, and Vr7, of FIG. 5A) or verify operation (e.g. see verify target levels Vv1, Vv2, Vv3, Vv4, Vv5, Vv6, and Vv7 of FIG. 5A) in order to sense whether a threshold voltage of the concerned memory cell has reached such level. After applying the word line voltage, the conduction current of the memory cell is measured to determine whether the memory cell turned on (conducted current) in response to the voltage applied to the word line. If the conduction current is measured to be greater than a certain value (e.g., Isense), then it is assumed that the memory cell turned on and the voltage applied to the word line is greater than the threshold voltage of the memory cell. If the conduction current is not measured to be greater than the certain value, then it is assumed that the memory cell did not turn on and the voltage applied to the word line is not greater than the threshold voltage of the memory cell. During a read or verify process, the unselected data memory cells are provided with one or more read pass voltages (also referred to as bypass voltages) at their control gates so that these data memory cells will operate as pass gates (e.g., conducting current regardless of whether they are programmed or erased), select gates of selected NAND strings are provided with sufficient voltage (e.g., select voltages via select lines) to make corresponding select transistors conductive ("turn on") and dummy memory cells of selected NAND strings are provided with sufficient voltage (e.g., dummy word line voltage via dummy word lines) to make corresponding dummy memory cells conductive.

There are many ways to measure the conduction current of a memory cell during sensing in a read or verify operation. In one example, the conduction current of a memory cell is measured by the rate it discharges or charges a dedicated capacitor in the sense amplifier. In another example, the conduction current of the selected memory cell allows (or fails to allow) the NAND string that includes the memory cell to discharge a corresponding bit line. The voltage on the bit line is measured after a period of time to see whether it has been discharged or not. Note that the technology described herein can be used with different methods known in the art for sensing during verify or read operations. Other read and verify techniques known in the art can also be used.

Figure 5B:
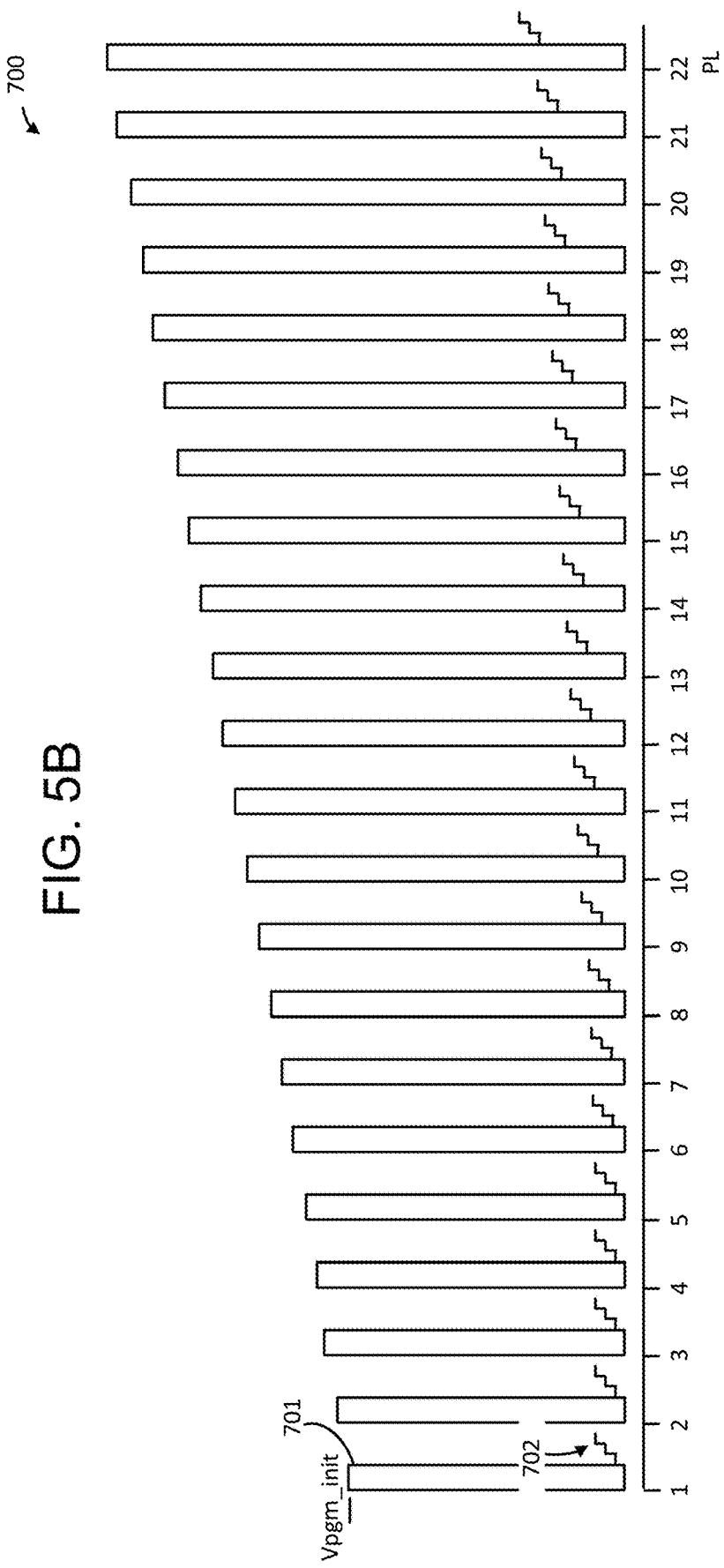

FIG. 5B depicts a voltage signal used in a series of program loops in an example program operation. The horizontal axis denotes a program loop (PL) number, ranging from 1-22, and the vertical axis denotes voltage (e.g., voltage applied via a selected word line to control gates of data memory cells to be programmed). During a program operation, program loops are performed for a selected word line in a selected block in each plane. A program loop comprises a program portion (program step) in which a program voltage or pulse is applied to the selected word line followed by a verify portion (verify step) in which a verify signal is applied to the selected word line while one or more verify tests are performed for the associated memory cells. Other than the erased state, each assigned state has a verify voltage which is used in the verify test for the state in a program operation.

The voltage signal 700 includes a series of program voltages, including an initial program voltage 701, which are applied to a word line selected for programming. In this example, the voltage signal includes program voltages which increase stepwise in amplitude in one or more program loops of a programming pass using a fixed or varying step size. A successful completion occurs when the threshold voltages of the selected memory cells reach the verify voltages of the assigned data states.

A program operation can include a single programming pass or multiple programming passes, where each pass uses incremental step pulse programming, for instance.

The verify signal in each program loop, including example verify signal 702, can include one or more verify voltages applied to a selected word line, based on the assigned data states which are being verified for the program loop. The verify tests can encompass lower assigned data states and then midrange assigned data states and then higher assigned data states as the program operations proceeds. The example verify signals depict three verify voltages as a simplification.

All memory cells may initially be in the erased state at the beginning of the program operation, for instance. After the program operation is completed, the data can be read from the memory cells using read voltages which are between the Vth distributions. At the same time, a read pass voltage, Vpass (e.g., 8-10 V), also referred to as pass voltage, is applied to the remaining data word lines. By testing whether the Vth of a given memory cell is above or below one or more of the read reference voltages, the system can determine the data state which is represented by a memory cell. These voltages are demarcation voltages because they demarcate between Vth ranges of different data states.

Moreover, the data which is programmed or read can be arranged in pages. For example, with four data states, or two bits per cell, two logical pages of data can be stored together in a page. An example encoding of bits for the Er, A, B and C states is 11, 10, 00 and 01, respectively, in the format of upper page (UP) bit/lower page (LP) bit. A lower page read may use VrA and VrC and an upper page read may use VrB.

With eight data states, or three bits per cell, three pages of data can be stored. An example encoding of bits for the Er, A, B, C, D, E, F and G states is 111, 110, 100, 000, 010, 011, 001 and 101, respectively. Memories that store more than one bit per cell may be referred to as Multi-Level Cell (MLC) memory, which includes Three Level Cell (TLC) memory (storing three bits per cell using eight data states) and Quad Level Cell (QLC) memory (storing four bits per cell using sixteen data states). Memories that store one bit per cell using two data states may be referred to as Single Level Cell (SLC) memory.

After data is programmed in data memory cells (e.g., as illustrated in FIGS. 5A-B), data may be read from a non-volatile memory array (e.g., in response to a command from a controller, host, or otherwise). In some cases, threshold voltage distributions of data memory cells that are read during a read operation may be changed from corresponding threshold voltage distributions of the data memory cells during verify steps of a program operation used to program the data memory cells (e.g., as illustrated in FIG. 5B).

Figure 6:
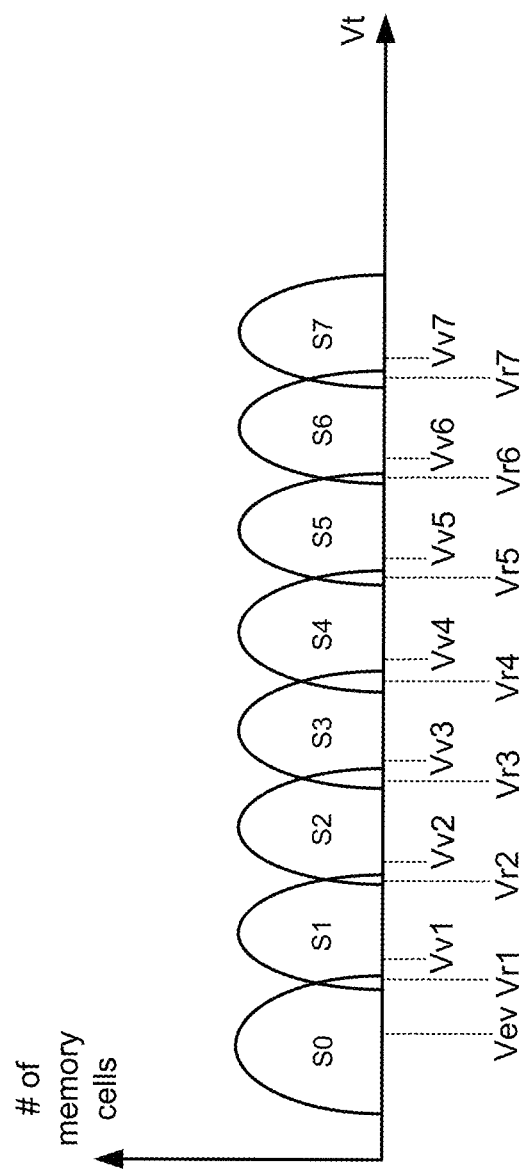
FIG. 6 illustrates an example of threshold voltage distributions of memory cells.

FIG. 6 shows an example of threshold voltage distributions of a plurality of data memory cells found by performing a read operation (e.g., a read operation directed to the data memory cells that were programmed as shown in FIGS. 5A-B). Distributions S0-S7 are partially overlapping because distributions are wider than shown in FIG. 5A. Such wider distributions may result in misreading of stored data (e.g., data memory cells in a lower tail of a distribution may be read as being in a lower state so that some data memory cells in state S1 are read as being in S0 when read at Vr1, some data memory cells in state S2 are read as being in state S1 when read at Vr2, and so on). While some errors may be corrected by ECC, it may be desirable to reduce the number of such errors. Accordingly, it may be desirable to have relatively narrow or tight distributions and to avoid broad or wide distributions (e.g., distributions that might have significant overlap).

Figure 7:
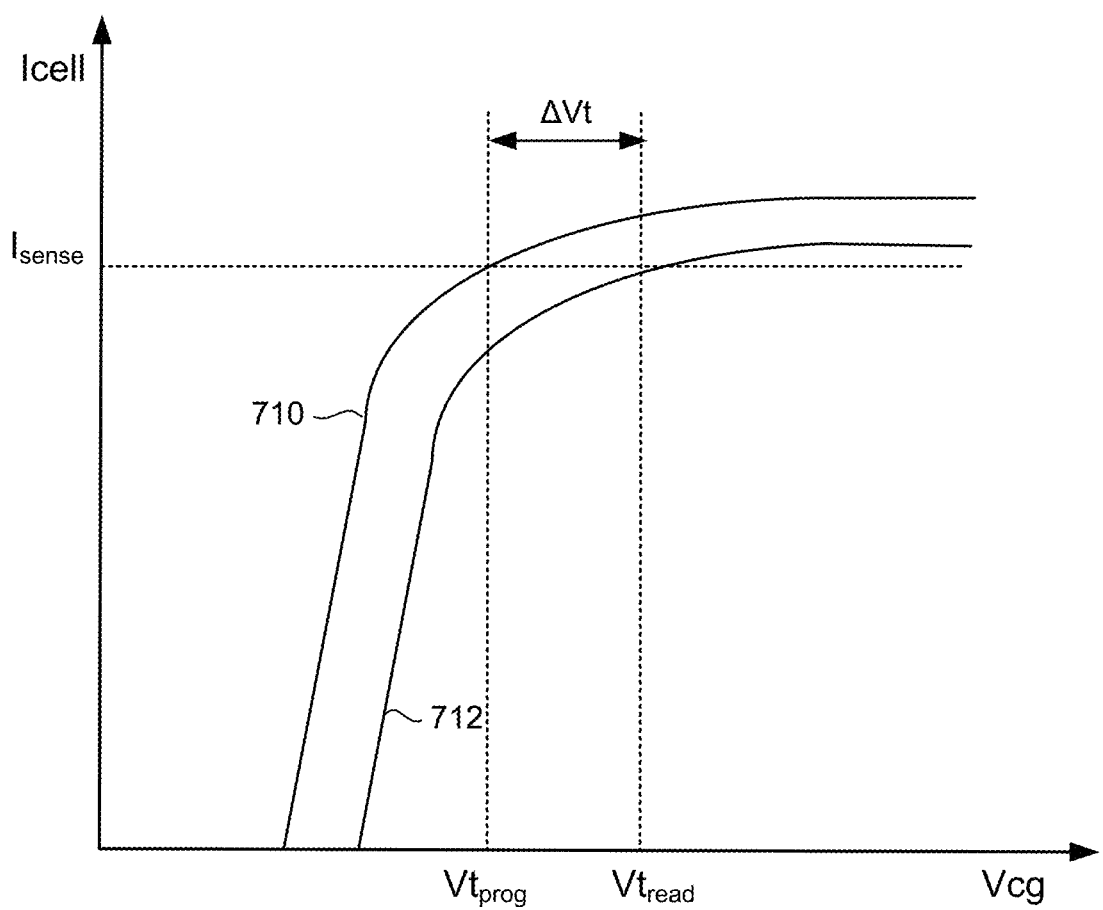
FIG. 7 illustrates examples of verify and read currents.

FIG. 7 illustrates an example of some differences between current-voltage (I-V) characteristics of memory cells at a time of programming data and at a subsequent time of reading the data. The sensed current flowing through a data memory cell (Icell) is shown on the vertical axis and control gate voltage (Vcg, which may be applied via a word line) is shown on the horizontal axis. A first curve 710 shows cell current as a function of control gate voltage at a time of programming (e.g., at a first time, during a verify step of a program operation). A second curve 712 shows cell current as a function of control gate voltage at a time of reading (e.g., at a second time, during a read operation). A sense current, Isense, is shown to indicate a current used for sensing in both the verify step of the program operation and in the read operation (e.g., as a reference current that is compared with Icell). The sensed threshold voltages are different as shown, with curve 710 intersecting Isense at voltage Vtprog (a first threshold voltage) and curve 712 intersecting Isense at $Vt_{read}$ (a second threshold voltage), corresponding to a shift in threshold voltage of ΔVt.

While FIG. 7 shows an example of a shift in threshold voltage of a data memory cell between the time the data memory cell is programmed to the time it is read, the amount of threshold voltage shift may not be uniform for all data memory cells. For example, some data memory cells may experience more threshold voltage shift than others. Such varied threshold voltage shift may cause threshold voltage distributions of a population of data memory cells to widen, which may be undesirable (e.g., may result in a significant number of errors).

Figure 8A:
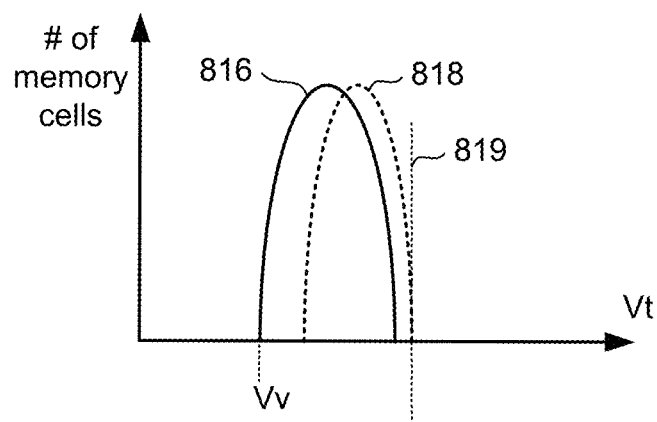
FIGS. 8A-C illustrate examples of threshold voltage distributions of data memory cells in NAND strings.
Figure 8B:
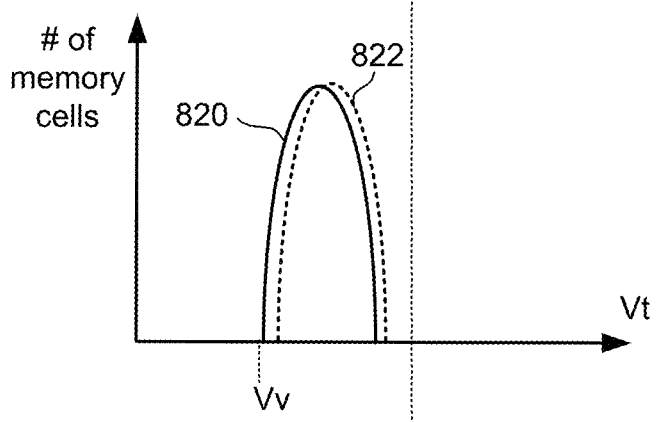
Figure 8C:
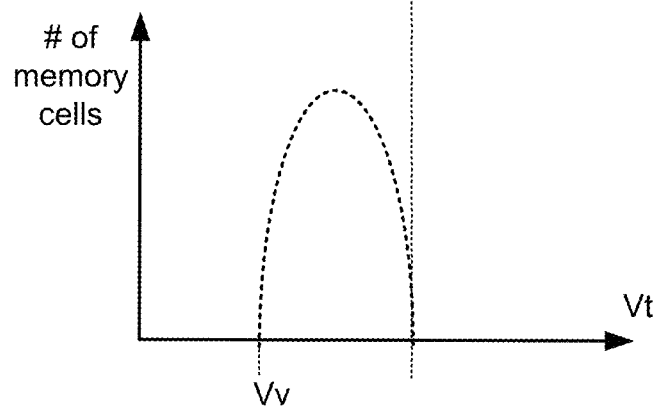

FIGS. 8A-C illustrate an example of threshold voltage distributions of different data memory cells experiencing different threshold voltage shifts in what may be considered an example of a "back-pattern effect."

FIG. 8A illustrates an example of a first threshold voltage distribution 816 for a first population of data memory cells at a first time (e.g., during a verify step of a program operation to program data in the data memory cells) and a second threshold voltage distribution 818 (dotted line) for the first population of data memory cells at a second time (e.g., during a read operation to read the data that was previously programmed). For example, the first population of data memory cells may include some or all data memory cells that are connected by a first data word line. FIG. 8A shows that the threshold voltages generally increase (up to upper voltage 819) and that the distribution of threshold voltages becomes narrower (e.g., second threshold voltage distribution 818 has a smaller standard deviation than first threshold voltage distribution 816).

FIG. 8B illustrates another example of a first threshold voltage distribution 820 for a second population of data memory cells at a first time (e.g., during a verify step of a program operation to program data in the data memory cells) and a second threshold voltage distribution 822 (dotted line) for the second population of data memory cells at a second time (e.g., during a read operation to read the data that was previously programmed). For example, the second population of data memory cells may include some or all data memory cells connected by a second data word line. FIG. 8B shows that the threshold voltages generally increase, and that the distribution of threshold voltages becomes narrower. The increase in threshold voltage and the narrowing of the threshold voltage distribution are both less in FIG. 8B than in the example of FIG. 8A.

Data memory cells along different word lines may have different threshold voltage changes for various reasons. For example, after data memory cells of a given data word line are programmed, additional data memory cells may be programmed, which may have an effect on the data memory cells of the given data word line. Word lines may be programmed in a predetermined programming order or sequence (e.g., proceeding sequentially from word line to word line). For later programmed word lines (e.g., word lines that are at or near the end of the programming order), there may be few additional word lines programmed after verification occurs so that there is relatively little change in threshold voltage distribution between a verify and a subsequent read (e.g., as shown between first threshold voltage distribution 820 and second threshold voltage distribution 822 of FIG. 8B). In contrast, for earlier programmed word lines in the programming order (e.g., word lines that are at or near the beginning of the programming order), a significant number of additional word lines are programmed after verification occurs so that there may be a relatively large change in threshold voltage distribution (e.g., as shown between first threshold voltage distribution 816 and second threshold voltage distribution 818 of FIG. 8A).

FIG. 8C shows a threshold voltage distribution 826, which represents the threshold voltage distributions of both the first and second populations during a read operation (e.g., the combination of second threshold voltage distribution 818 and second threshold voltage distribution 822). Threshold voltage distribution 826 is wider than either second threshold voltage distribution 818 or second threshold voltage distribution 822 because of the different threshold shifts of different word lines.

In some cases, measures may be used to mitigate effects of word line-to-word line variation in threshold voltage shift. For example, different read voltages may be applied to the selected word line when reading different word lines.

Figure 9A:
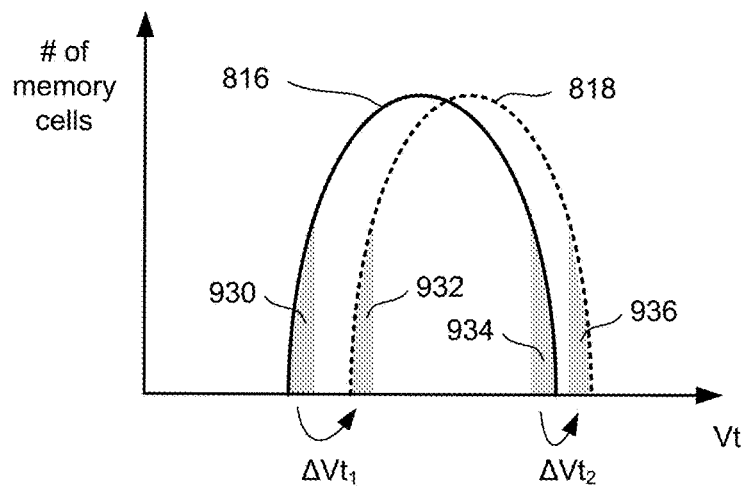
FIGS. 9A-C illustrate narrowing of a threshold voltage distribution of data memory cells of a word line after programming of subsequent word lines.
Figure 9B:
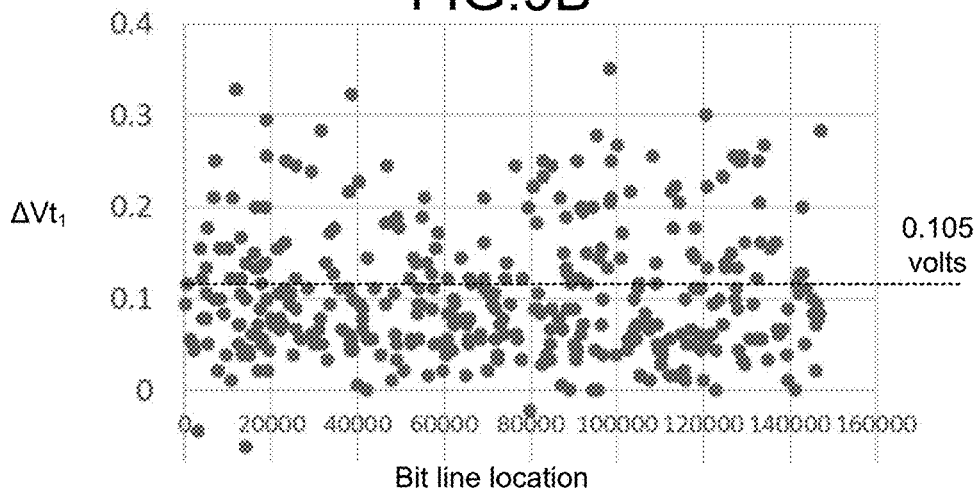
Figure 9C:
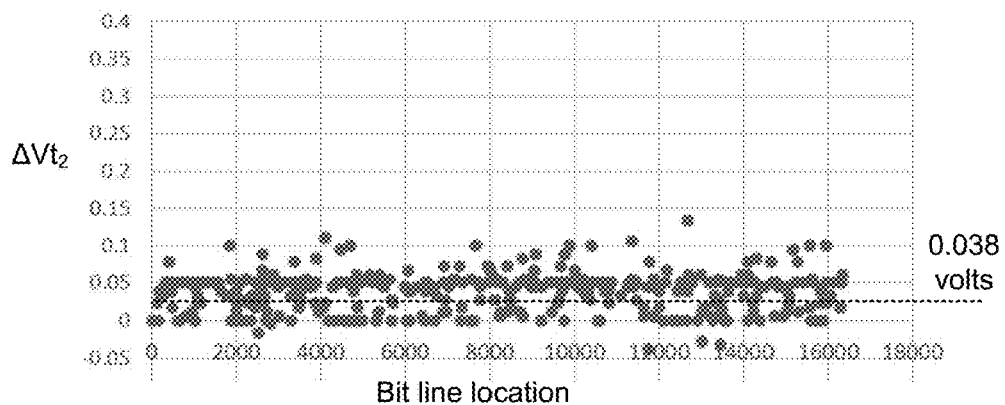

FIGS. 9A-C illustrate how a threshold voltage distribution for data memory cells of a word line may become narrower between a program operation and a subsequent read operation. FIG. 9A illustrates first threshold voltage distribution 816 (e.g., from a verify step of a program operation) and second threshold voltage distribution 818 (e.g., from a read operation). First threshold voltage distribution 816 includes a lower tail 930, which represents data memory cells with threshold voltages that are lower than most threshold voltages of first threshold voltage distribution 816 (e.g., bottom 5%, 10%, or other percentage). Second threshold voltage distribution 818 includes lower tail 932, which represents data memory cells with threshold voltages that are lower than most threshold voltages of second threshold voltage distribution 818 (e.g., data memory cells of lower tail 930 in a subsequent read operation after additional word lines are programmed, and threshold voltages have shifted). First threshold voltage distribution 816 includes upper tail 934, which represents data memory cells with threshold voltages that are higher than most threshold voltages of first threshold voltage distribution 816 (e.g., top 5%, 10%, or other percentage). Second threshold voltage distribution 818 includes upper tail 936, which represents data memory cells with threshold voltages that are higher than most threshold voltages of second threshold voltage distribution 818 (e.g., data memory cells of upper tail 934 in a subsequent read operation after additional word lines are programmed, and threshold voltages have shifted).

FIG. 9B shows experimental data indicating threshold voltage shift (ONO for data memory cells at different bit line locations along a word line (bit line locations along the horizontal axis) as a result of subsequent programming of additional word lines. Threshold voltage shift $\Delta Vt_1$ in FIG. 9B is for lower tail memory cells and includes data points representing threshold voltage shift of data memory cells between lower tail 930 and lower tail 932 of FIG. 9A. FIG. 9B shows that between lower tail 930 of first threshold voltage distribution 816 and lower tail 932 of second threshold voltage distribution 818, data memory cells have an average increase in threshold voltage ($\Delta Vt_1$) of 0.105 volts.

FIG. 9C shows experimental data indicating threshold voltage shift ($\Delta Vt_2$) for other data memory cells at different bit line locations along a word line as a result of subsequent programming of additional word lines. Threshold voltage shift $\Delta Vt_2$ in FIG. 9C is for upper tail memory cells and includes data points representing threshold voltage shift of data memory cells between upper tail 934 and upper tail 936 of FIG. 9A. FIG. 9C shows that between upper tail 934 of first threshold voltage distribution 816 and upper tail 936 of second threshold voltage distribution 818, data memory cells have an increase in threshold voltage of an average of 0.038 volts, which is less than the average $\Delta Vt_1$ for the lower tail data memory cells. Because lower tail memory cells increase threshold voltage more than upper tail memory cells do, the threshold voltage distribution becomes narrower, which can be beneficial (e.g., may result in fewer erroneous bits when read).

Figure 10A:
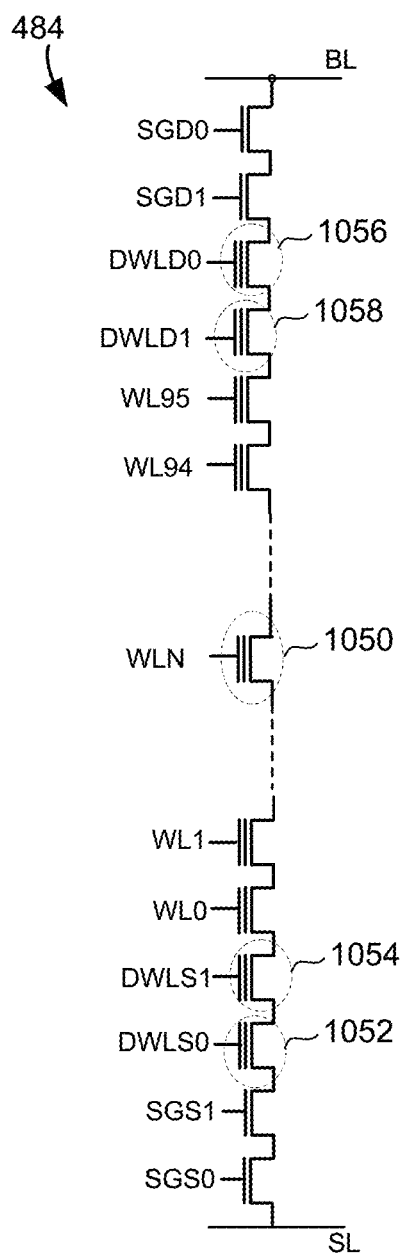
FIGS. 10A-B illustrate resistance along a NAND string.

The effects illustrated in FIGS. 7-9C may be understood with respect to changes that occur in a NAND string as data memory cells are programmed, including changing resistances along the NAND string. FIG. 10A is a schematic illustration of NAND string 484, which was previously shown in FIG. 4C. NAND string 484 includes a plurality of data memory cells coupled to a plurality of data word lines, WL0-WL95 (including data memory cell 1050 coupled to data word line WLN, where N may be any number from 3 to 93), in series with a plurality of dummy memory cells connected to a plurality of dummy word lines DWLS0, DWLS1, DWLD0, DWLD1. Select transistors are provided at each end and are coupled to corresponding select lines SGS0, SGS1, SGD0, SGD1. A bit line (BL) connects to the drain end of NAND and a source line (SL) connects to the source end of NAND string 484. Each component connected in series may contribute to the overall resistance of NAND string 484. Overall resistance may be greater for longer NAND strings (e.g., a NAND string with 126, 230 or more data memory cells may generally have higher resistance than a NAND string with 96 data memory cells). While the present application refers to examples with specific numbers of data word lines per block (and data memory cells per NAND string), the present technology is not limited to such specific examples and may be applicable to NAND strings of any length (e.g., 230 or more data memory cells per NAND string).

Figure 10B:
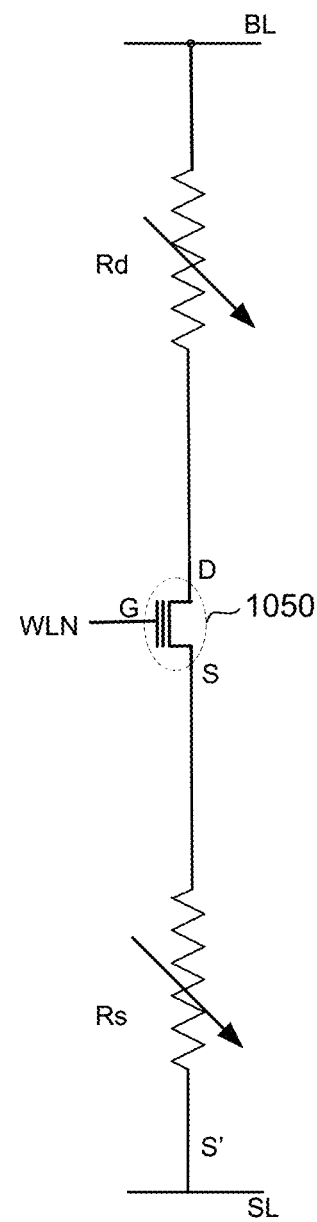

FIG. 10B shows a simplified schematic of NAND string 484 when sensing data memory cell 1050. The resistance of drain side select transistors, drain side dummy memory cells and drain side data memory cells (data memory cells between data memory cell 1050 and bit line BL) is represented by a drain side variable resistance, Rd, extending between the bit line BL and data memory cell 1050. The resistance of source side select transistors, source side dummy memory cells and source side data memory cells (data memory cells between data memory cell 1050 and source line SL) is represented by a source side variable resistance, Rs. When programming proceeds in a predetermined order from the drain side to the source side (e.g., starting with word line 95, then word line 94, and so on from the upper word lines to lower word lines), word lines 95 to N+1 are programmed prior to programming data memory cell 1050 so that Rd may have a resistance that reflects programmed memory cells, which does not change subsequently during programming of word lines WLN to WL0. Word lines WLN-1 to WL0 are programmed after programming data memory cell 1050. Source side variable resistance Rs may have a resistance during verify that reflects erased memory cells along word lines WLN-1 to WL0. Subsequently, when word lines WLN-1 to WL0 are programmed, Rs may change (increase) as data memory cells are programmed (e.g., with randomized data) and their threshold voltages increase (on average). This change may cause a difference between a threshold voltage sensed during verify and a threshold voltage subsequently sensed during a read operation.

The increase in Rs for data memory cells of a given word line may depend on the number of data memory cells that are subsequently programmed (e.g., depend on the value of N, where WL95 is the first programmed word line, WL0 is the last programmed data word line, and N is between 95 and 0). Data memory cells of later programmed word lines (e.g., WL10-WL0) may have relatively few data memory cells in NAND string 484 programmed after they are programmed so that the source side resistance Rs does not change significantly between verify and read for such later programmed word lines. In contrast, data memory cells of earlier programmed word lines (e.g., WL95-WL85) may have a large number of data memory cells in NAND string 484 programmed after they are programmed so that Rs changes significantly between a verify and a subsequent read operation for such earlier programed data memory cells.

The threshold voltage of data memory cell 1050 that is sensed in a sense operation (e.g., verify or read) depends on the voltage between the gate, G, and source, S, which is $V_{GS}$ and may be affected by Rs (and the current between the drain, D, and the source S, which is Ids) according to the following equation:

$$V_{GS} = V_{GS'} - Ids * Rs$$

Where $V_{GS'}$ is the voltage between the gate, G, and the source line SL (shown as node S'). The change in Rs caused by subsequent programming of additional word lines is different for different word lines which affects $V_{GS}$.

Aspects of the present technology are directed to controlling series resistance along a NAND string (e.g., one or more of Rs and Rd) when reading at least some data memory cells in order to narrow threshold voltage distributions. For example, source side resistance, Rs, may be controlled to add some resistance for performing a read operation on at least some word lines. For example, Rs may be controlled by tuning resistance of source side dummy memory cell 1052 and/or source side dummy memory cell 1054 to add a desired resistance (in examples with different numbers of dummy memory cells any dummy memory cell or combination of dummy memory cells may be tuned). Alternatively, or in addition, drain side resistance, Rd, may be controlled to add some resistance for performing a read operation on at least some word lines. For example, Rd may be controlled by tuning resistance of drain side dummy memory cell 1056 and/or drain side dummy memory cell 1058 (and/or other dummy memory cells in other arrangements).

In one example, a first dummy word line voltage is applied to one or more of the dummy word lines (e.g., one or more of DWLS0 and DWLS1) in a verify step of a program operation to program data memory cell 1050 and a second dummy word line voltage is applied to the one or more dummy word lines in a read operation to read data memory cell 1050. The first dummy word line voltage may be higher than the second dummy word line voltage so that the first dummy word line voltage causes dummy memory cell(s) to have a first resistance (e.g., a low resistance) and the second dummy word line voltage causes dummy memory cell(s) to have a second resistance that is greater than the first resistance (e.g., to increase Rs). This may cause read threshold voltage distributions to be narrower in the read operation with the dummy memory cells having the second resistance than if they had the first resistance (e.g., threshold voltage distribution may be narrower than if the first dummy word line voltage was applied and dummy memory cells had the first resistance). The second dummy word line voltage may be optimized for a particular NAND memory array, for example, to achieve a desired amount of threshold voltage distribution narrowing. Table 1 summarizes different dummy WL voltages used for verify and subsequent read operations. For example, "High" voltage may be in the range of 6-9 volts, while "Low" voltage may be in the range of 4-6 volts (different voltages may be used in different memories).

TABLE 1

| | Dummy WL voltage |
| --- | --- |
| Verify | High |
| Read | Low |

In some cases, the control of series resistance along a NAND string (e.g., using dummy memory cells) may be selectively applied. For example, threshold voltage distributions of earlier programmed word lines may be sufficiently narrow due to resistance added by subsequently programmed word lines while threshold voltage distributions of later programmed word lines may not experience a significant narrowing because there are few subsequently programmed word lines and therefore little increase in Rs. Reduced dummy word line voltage(s) to increase Rs may be selectively applied only when reading later programmed word lines in some embodiments. Earlier programmed word lines may be read with a higher dummy word line voltage (e.g., a first dummy word line voltage, which may be the same dummy word line voltage used during verify). Thus, word lines may be divided into two (or more) groups, earlier programmed data word lines and later programmed data word lines. Division may be at any suitable location (e.g., groups may be equal in size, or one group may be larger than the other). Read operations may be performed by applying different dummy word line voltages when reading data memory cells along word lines of these groups (e.g., a first dummy word line voltage for read operations directed to earlier programmed data word lines and a second dummy word line voltage for read operations directed to later programmed data word lines). Table 2 summarizes different dummy word line voltages used for verify and subsequent read operations including different dummy word line voltages used when reading earlier and later programmed word lines.

TABLE 2

| | Word Line | Dummy WL voltage |
| --- | --- | --- |
| Verify | All | High |
| Read | Earlier programmed | High |
| | Later programmed | Low |

In other examples, data word lines may be divided into more than two groups and different dummy word line voltages may be used for read operations of each group. The number of groups (and the number of different dummy word line voltages) can be up to the number of data word lines (e.g., 96 groups, each having a single data word line, and 96 different dummy word line voltages in the example of FIG. 10A). Thus, series resistance (e.g., resistance of source side dummy memory cells 1052 and 1054) may be tuned individually for each group of a plurality of groups of word lines. Table 3 summarizes different word line voltages used for verify and subsequent read operations including a range of different dummy word line voltages used when reading data word lines of a block.

TABLE 3

| | Word Line | Dummy WL voltage |
| --- | --- | --- |
| Verify | All | High |
| Read | Earlier programmed | High |
| | . | . |
| | . | . |
| | . | . |
| | Later programmed | Low |

In another example, resistance (e.g., Rs and/or Rd) may be increased by storing charge in dummy memory cells along one or more dummy word lines (e.g., one or more of DWLS0, DWLS1, DWLD0, DWLD1) to raise threshold voltages of the dummy memory cells. This may be an alternative to using different dummy word line voltages for verify and read or may be combined with using different dummy word line voltages. Charge may be added to dummy memory cells in an operation that is similar to a program operation directed to data memory cells (e.g., as illustrated in FIGS. 5A-B) although no data is stored (e.g., all dummy memory cells along a dummy word line may receive the same amount of charge, which does not correspond to any host data). Stored charge increases threshold voltages of dummy memory cells and thus increases their resistance during a read operation. An operation to store charge in dummy memory cells may be performed after all data word lines of a block are programmed and prior to reading data from the block. Charge added to dummy memory cells may be removed in an erase operation (when erasing data memory cells) to leave dummy memory cells in the erased state. Subsequently, after the block is programmed again, charge may be added to the dummy memory cells (e.g., in a program-type step subsequent to programming of the last data word line in a programming order). The amount of charge added to dummy memory cells may be tuned to achieve a desired result, e.g., to achieve a desired threshold voltage distribution narrowing in a given memory array.

While the above examples refer to NAND MLC memory, the present technology is not limited to such memory and may be applied to NAND memories storing any number of bits per cell (e.g., SLC). And the present technology is not limited to any particular configuration of NAND strings and may be applied to NAND strings of different lengths having different numbers of data memory cells and dummy memory cells.

Figure 11:
FIG. 11 illustrates an example of a method of operating a memory array.

FIG. 11 shows an example of a method of operating a non-volatile memory array that includes NAND strings (e.g., memory array 126 or 326 as illustrated in FIGS. 3-4D), each NAND string including a plurality of data memory cells coupled to a plurality of data word lines in series with a plurality of dummy memory cells connected to a plurality of dummy word lines (e.g., as shown in FIG. 10A). The method includes applying a first dummy word line voltage to one or more dummy word lines of the plurality of dummy word lines in a verify step of a program operation to program the data memory cells 1160 and subsequently, applying a second dummy word line voltage to the one or more dummy word lines of the plurality of dummy word lines in a read operation to read the data memory cells 1162.

Figure 12:
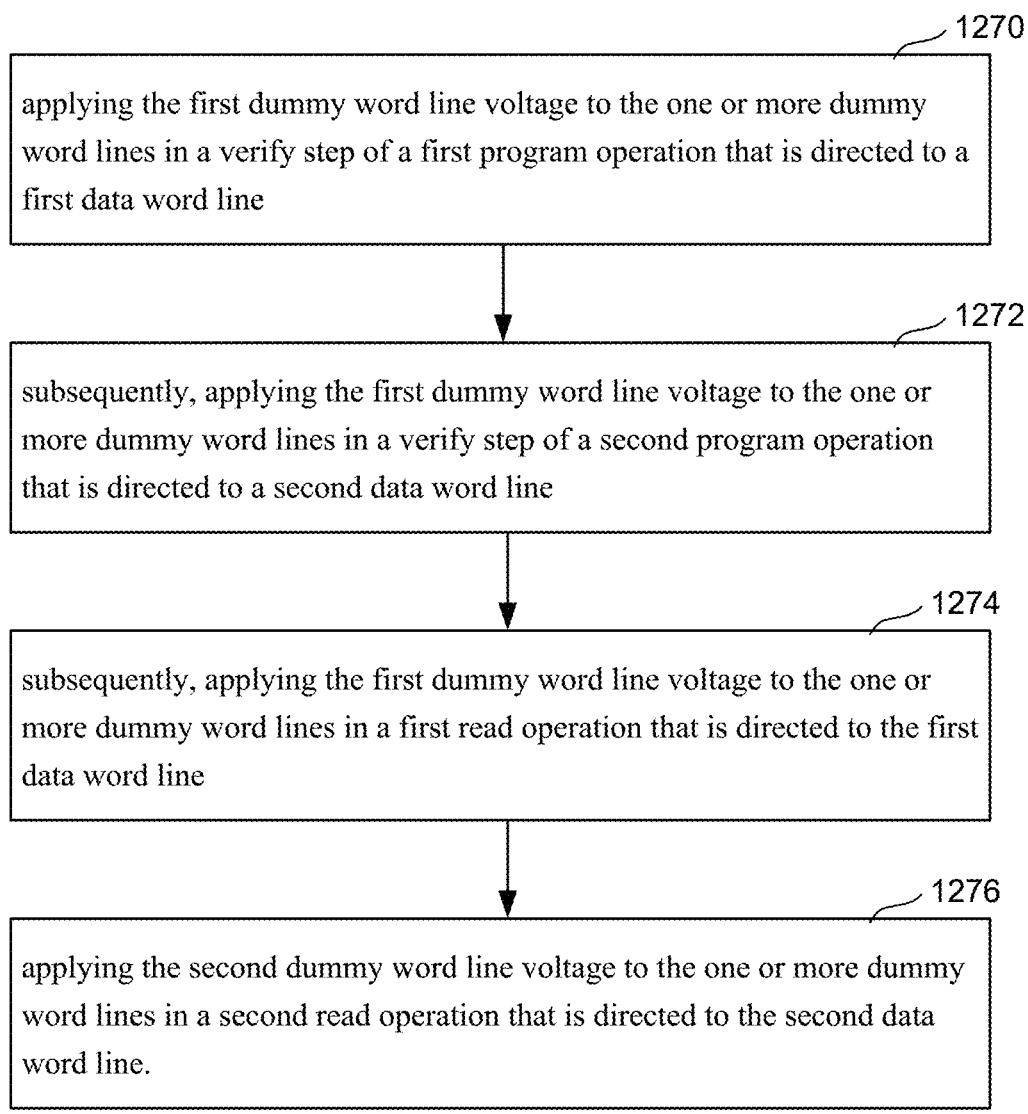
FIG. 12 illustrates an example of a method of operating a memory array.

FIG. 12 shows a more detailed example of a method of operating a non-volatile memory array that includes NAND strings (e.g., memory array 126 or 326 as illustrated in FIGS. 3-4D), each NAND string including a plurality of data memory cells coupled to a plurality of data word lines in series with a plurality of dummy memory cells connected to a plurality of dummy word lines (e.g., as shown in FIG. 10A). The method includes applying the first dummy word line voltage to the one or more dummy word lines in a verify step of a first program operation that is directed to a first data word line 1270 and subsequently, applying the first dummy word line voltage to the one or more dummy word lines in a verify step of a second program operation that is directed to a second data word line 1272 (e.g., first data word line is earlier programmed and second data word line is later programmed). The method further comprises, subsequently, applying the first dummy word line voltage to the one or more dummy word lines in a first read operation that is directed to the first data word line 1274 (e.g., earlier programmed data word line) and applying a second dummy word line voltage to the one or more dummy word lines in a second read operation that is directed to the second data word line 1276 (e.g., later programmed word line).

Aspects of the present technology may be implemented using various control circuits to increase resistance of one or more dummy memory cells from a first resistance for program-verify steps to a second resistance for subsequent read operations directed to the plurality of data memory cells. An example of such control circuits may include a row decoder circuit (e.g., row decoder circuit 124) or row control circuitry (e.g., row control circuitry 320) and column decoder (e.g., column decoder 132) or column control circuitry (e.g., column control circuitry 364) controlled by logic circuits (e.g., control circuit 110 or system control logic 360). Such control circuits may be configured to apply a first dummy word line voltage to one or more dummy word lines of the plurality of dummy word lines in a verify step of a program operation to program data memory cells and apply a second dummy word line voltage to the one or more dummy word lines in a read operation to read the data memory cells. The combination of row decoder circuit 124, column decoder 132 and control circuit 110 may be considered an example of a means for increasing resistance of one or more dummy memory cells of a plurality of dummy memory cells from a first resistance for program-verify steps directed to the plurality of data memory cells to a second resistance for subsequent read operations directed to the plurality of data memory cells. The combination of row control circuitry 320, column control circuitry 364 and system control logic 360 may be considered another example of a means for increasing resistance of one or more dummy memory cells of a plurality of dummy memory cells from a first resistance for program-verify steps directed to the plurality of data memory cells to a second resistance for subsequent read operations directed to the plurality of data memory cells. Such means may be configured to increase resistance by adding charge to the plurality of dummy memory cells after the program-verify steps and prior to the read operations. Such means may be configured to increase resistance by applying a first dummy word line voltage to control gates of the plurality of dummy memory cells for the program-verify steps and (selectively or uniformly) applying a second dummy word line voltage to the control gates for the read operations, the second dummy word line voltage is lower than the first dummy word line voltage.

In one embodiment an apparatus includes a control circuit configured to connect to memory cells connected in series in NAND strings. Each NAND string includes a plurality of data memory cells coupled to a plurality of data word lines in series with a plurality of dummy memory cells connected to a plurality of dummy word lines. The control circuit is configured to apply a first dummy word line voltage to one or more dummy word lines of the plurality of dummy word lines in a verify step of a program operation to program data memory cells and apply a second dummy word line voltage to the one or more dummy word lines in a read operation to read the data memory cells.

The first dummy word line voltage is higher than the second dummy word line voltage. The first dummy word line voltage applied to the one or more dummy word lines may cause dummy memory cells to have a first resistance and the second dummy word line voltage applied to the one or more dummy word lines may cause dummy memory cells to have a second resistance that is greater than the first resistance. Threshold voltage distributions of the plurality of data memory cells in the read operation may be narrower with the dummy memory cells having the second resistance than having the first resistance. The control circuit may be further configured to apply the first dummy word line voltage to the one or more dummy word lines in a first read operation that is directed to a first data word line and apply the second dummy word line voltage to the one or more dummy word lines in a second read operation that is directed to a second data word line. The plurality of data word lines may be programmed in a programming order and the first data word line may be prior to the second data word line in the programming order. The control circuit may be further configured to store charge in one or more dummy memory cells along the one or more dummy word lines prior to the read operation to increase resistance of the one or more dummy memory cells from a resistance of an erased dummy memory cell to a higher resistance. The one or more dummy word lines may be located between a source side select gate and the plurality of data word lines. The control circuit may be further configured to apply a plurality of dummy word line voltages to the one or more dummy word lines in a plurality of read operations directed to a plurality of data word lines, including applying higher dummy word line voltages to the one or more dummy word lines for read operations directed to later programmed data word lines and applying lower dummy word line voltages to the one or more dummy word lines for read operations directed to earlier programmed word lines.

An example method of operating a non-volatile memory array that includes NAND strings, each NAND string including a plurality of data memory cells coupled to a plurality of data word lines in series with a plurality of dummy memory cells connected to a plurality of dummy word lines, includes applying a first dummy word line voltage to one or more dummy word lines of the plurality of dummy word lines in a verify step of a program operation to program the data memory cells; and subsequently, applying a second dummy word line voltage to the one or more dummy word lines of the plurality of dummy word lines in a read operation to read the data memory cells.

The first dummy word line voltage may be higher than the second dummy word line voltage such that the first dummy word line voltage applied to the one or more dummy word lines causes dummy memory cells to have a first resistance, the second dummy word line voltage applied to the one or more dummy word lines causes dummy memory cells to have a second resistance, and the second resistance is greater than the first resistance. The method may further include applying the first dummy word line voltage to the one or more dummy word lines in a verify step of a first program operation that is directed to a first data word line; subsequently, applying the first dummy word line voltage to the one or more dummy word lines in a verify step of a second program operation that is directed to a second data word line; subsequently, applying the first dummy word line voltage to the one or more dummy word lines in a first read operation that is directed to the first data word line; and applying the second dummy word line voltage to the one or more dummy word lines in a second read operation that is directed to the second data word line. The method may further include, subsequent to the program operation and prior to the read operation, storing charge in one or more dummy memory cells along the one or more dummy word lines to increase resistance of the one or more dummy memory cells from a resistance of an erased dummy memory cell to a higher resistance. The one or more dummy word lines may be located between a source side select gate and the plurality of data word lines. The method may further include applying the first dummy word line voltage to the one or more dummy word lines in verify steps of a plurality of program operations to program the plurality of data word lines; and subsequently, applying a plurality of dummy word line voltages to the one or more dummy word lines in a plurality of read operations, including applying higher dummy word line voltages to the one or more dummy word lines for read operations directed to later programmed data word lines and applying lower dummy word line voltages to the one or more dummy word lines for read operations directed to earlier programmed data word lines.

An example non-volatile storage device includes: a plurality of NAND strings of memory cells, each NAND string having a plurality of data memory cells coupled to a plurality of data word lines in series with a plurality of dummy memory cells connected to a plurality of dummy word lines; and means for increasing resistance of one or more dummy memory cells of the plurality of dummy memory cells from a first resistance for program-verify steps directed to the plurality of data memory cells to a second resistance for subsequent read operations directed to the plurality of data memory cells.

The means for increasing resistance may be configured to increase resistance by adding charge to the plurality of dummy memory cells after the program-verify steps and prior to the read operations. The means for increasing resistance may be configured to increase resistance by applying a first dummy word line voltage to control gates of the plurality of dummy memory cells for the program-verify steps and applying a second dummy word line voltage to the control gates for the read operations, the second dummy word line voltage is lower than the first dummy word line voltage. The means for increasing resistance may be configured to selectively increase resistance only for read operations directed to later programmed data word lines of the plurality of data word lines. The plurality of NAND strings may be vertical NAND strings in a 3-D NAND array and the means for increasing resistance may be configured to selectively apply the second dummy word line voltage to the control gates of the plurality of dummy memory cells only for read operations directed to lower data word lines of the plurality of data word lines and to apply the first dummy word line voltage to the control gates of the plurality of dummy memory cells for read operations directed to higher data word lines.

For purposes of this document, reference in the specification to "an embodiment," "one embodiment," "some embodiments," or "another embodiment" may be used to describe different embodiments or the same embodiment.

For purposes of this document, a connection may be a direct connection or an indirect connection (e.g., via one or more others parts). In some cases, when an element is referred to as being connected or coupled to another element, the element may be directly connected to the other element or indirectly connected to the other element via intervening elements. When an element is referred to as being directly connected to another element, then there are no intervening elements between the element and the other element. Two devices are "in communication" if they are directly or indirectly connected so that they can communicate electronic signals between them.

For purposes of this document, the term "based on" may be read as "based at least in part on."

For purposes of this document, without additional context, use of numerical terms such as a "first" object, a "second" object, and a "third" object may not imply an ordering of objects but may instead be used for identification purposes to identify different objects.

For purposes of this document, the term "set" of objects may refer to a "set" of one or more of the objects.

The foregoing detailed description has been presented for purposes of illustration and description. It is not intended to be exhaustive or to limit to the precise form disclosed. Many modifications and variations are possible in light of the above teaching. The described embodiments were chosen in order to best explain the principles of the proposed technology and its practical application, to thereby enable others skilled in the art to best utilize it in various embodiments and with various modifications as are suited to the particular use contemplated. It is intended that the scope be defined by the claims appended hereto.

What is claimed is:

1. An apparatus, comprising:
  a control circuit configured to connect to memory cells connected in series in NAND strings, each NAND string including a plurality of data memory cells coupled to a plurality of data word lines in series with a plurality of dummy memory cells connected to a plurality of dummy word lines, the control circuit configured to:
apply a first dummy word line voltage to one or more dummy word lines of the plurality of dummy word lines in a verify step of a program operation to program data memory cells, apply the first dummy word line voltage to the one or more dummy word lines in a first read operation that is directed to a first data word line and apply a second dummy word line voltage to the one or more dummy word lines in a second read operation that is directed to a second data word line.

2. The apparatus of claim 1, wherein the first dummy word line voltage is higher than the second dummy word line voltage.

3. The apparatus of claim 2, wherein the first dummy word line voltage applied to the one or more dummy word lines causes dummy memory cells to have a first resistance and the second dummy word line voltage applied to the one or more dummy word lines causes dummy memory cells to have a second resistance that is greater than the first resistance.

4. The apparatus of claim 3, wherein threshold voltage distributions of the plurality of data memory cells in the read operation are narrower with the dummy memory cells having the second resistance than having the first resistance.

5. The apparatus of claim 1, wherein the plurality of NAND strings are vertical NAND strings in a 3-D NAND array.

6. The apparatus of claim 1, wherein the plurality of data word lines are programmed in a programming order and the first data word line is prior to the second data word line in the programming order.

7. The apparatus of claim 1, wherein the control circuit is further configured to:
store charge in one or more dummy memory cells along the one or more dummy word lines prior to the read operation to increase resistance of the one or more dummy memory cells from a resistance of an erased dummy memory cell to a higher resistance.

8. The apparatus of claim 1, wherein the one or more dummy word lines is/are located between a source side select gate and the plurality of data word lines.

9. The apparatus of claim 1 wherein the control circuit is further configured to:
apply a plurality of dummy word line voltages to the one or more dummy word lines in a plurality of read operations directed to a plurality of data word lines, including applying higher dummy word line voltages to the one or more dummy word lines for read operations directed to later programmed data word lines and applying lower dummy word line voltages to the one or more dummy word lines for read operations directed to earlier programmed word lines.

10. A method of operating a non-volatile memory array that includes NAND strings, each NAND string including a plurality of data memory cells coupled to a plurality of data word lines in series with a plurality of dummy memory cells connected to a plurality of dummy word lines, the method comprising:
applying a first dummy word line voltage to one or more dummy word lines of the plurality of dummy word lines in verify steps of a plurality of program operations to program the data memory cells; and
subsequently, applying a plurality of dummy word line voltages including at least a second dummy word line voltage to the one or more dummy word lines of the plurality of dummy word lines in a plurality of read operations to read the data memory cells, including applying higher dummy word line voltages to the one or more dummy word lines for read operations directed to later programmed data word lines and applying lower dummy word line voltages to the one or more dummy word lines for read operations directed to earlier programmed data word lines.

11. The method of claim 10, wherein the first dummy word line voltage is higher than the second dummy word line voltage such that the first dummy word line voltage applied to the one or more dummy word lines causes dummy memory cells to have a first resistance, the second dummy word line voltage applied to the one or more dummy word lines causes dummy memory cells to have a second resistance, and the second resistance is greater than the first resistance.

12. The method of claim 11, further comprising:
applying the first dummy word line voltage to the one or more dummy word lines in a verify step of a first program operation that is directed to a first data word line;
subsequently, applying the first dummy word line voltage to the one or more dummy word lines in a verify step of a second program operation that is directed to a second data word line;
subsequently, applying the first dummy word line voltage to the one or more dummy word lines in a first read operation that is directed to the first data word line; and
applying the second dummy word line voltage to the one or more dummy word lines in a second read operation that is directed to the second data word line.

13. The method of claim 10, further comprising:
subsequent to the program operation and prior to the read operation, storing charge in one or more dummy memory cells along the one or more dummy word lines to increase resistance of the one or more dummy memory cells from a resistance of an erased dummy memory cell to a higher resistance.

14. The method of claim 10, wherein the one or more dummy word lines is/are located between a source side select gate and the plurality of data word lines.

15. The method of claim 11, wherein threshold voltage distributions of the plurality of data memory cells in the plurality of read operations are narrower with the dummy memory cells having the second resistance than having the first resistance.

16. A non-volatile storage device comprising:
a plurality of NAND strings of memory cells, each NAND string having a plurality of data memory cells coupled to a plurality of data word lines in series with a plurality of dummy memory cells connected to a plurality of dummy word lines; and
means for increasing resistance of one or more dummy memory cells of the plurality of dummy memory cells from a first resistance for program-verify steps directed to the plurality of data memory cells to a second resistance for subsequent read operations directed to the plurality of data memory cells by applying a first dummy word line voltage to control gates of the plurality of dummy memory cells for the program-verify steps, applying the first dummy word line voltage to control gates of the plurality of dummy memory cells for read operations directed to higher data word lines and applying a second dummy word line voltage to the control gates for read operations directed to lower data word lines of the plurality of data word lines, the second dummy word line voltage is lower than the first dummy word line voltage.

17. The non-volatile storage device of claim 16, wherein the means for increasing resistance is configured to increase resistance by adding charge to the plurality of dummy memory cells after the program-verify steps and prior to the read operations.

18. The non-volatile storage device of claim 16, wherein the threshold voltage distributions of data memory cells in the read operations are narrower with the dummy memory cells having an increased resistance.

19. The non-volatile storage device of claim 16, wherein the means for increasing resistance is configured to selectively increase resistance only for read operations directed to later programmed data word lines of the plurality of data word lines.

20. The non-volatile storage device of claim 16, wherein the plurality of NAND strings are vertical NAND strings in a 3-D NAND array.

* * * * *